(12) United States Patent
Yang et al.

(10) Patent No.: US 11,847,023 B2
(45) Date of Patent: Dec. 19, 2023

(54) FLASH MEMORY APPARATUS AND STORAGE MANAGEMENT METHOD FOR FLASH MEMORY

(71) Applicant: Silicon Motion, Inc., Hsinchu County (TW)

(72) Inventors: Tsung-Chieh Yang, Hsinchu (TW); Hong-Jung Hsu, Hsinchu County (TW); Jian-Dong Du, Taoyuan (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 17/963,999

(22) Filed: Oct. 11, 2022

(65) Prior Publication Data

US 2023/0032032 A1 Feb. 2, 2023

Related U.S. Application Data

(63) Continuation of application No. 17/242,326, filed on Apr. 28, 2021, now Pat. No. 11,500,722, which is a
(Continued)

(30) Foreign Application Priority Data

Feb. 20, 2017 (TW) .................................. 106105508

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1072* (2013.01); *G06F 11/1076* (2013.01);
(Continued)

(58) Field of Classification Search
CPC ....... H04L 1/0042; H04L 1/08; H04L 1/1812; H04L 43/0829; H04L 43/0852
See application file for complete search history.

(56) References Cited

U.S. PATENT DOCUMENTS 6,903,972 B2   6/2005  Lasser
7,243,193 B2   7/2007  Walmsley
(Continued)

FOREIGN PATENT DOCUMENTS

CN      1567256 A      1/2005
CN      1571069 A      1/2005
(Continued)

OTHER PUBLICATIONS

Cai et al., "Error Patterns in MLC NAND Flash Memory: Measurement, Characterization, and Analysis", IEEE, Germany, 2012, pp. 1-6.
(Continued)

*Primary Examiner* — Esaw T Abraham
(74) *Attorney, Agent, or Firm* — Winston Hsu

(57) ABSTRACT

A flash memory method includes: classifying data into a plurality of groups of data; respectively executing error code encoding to generate first corresponding parity check code to store the groups of data and first corresponding parity check code into flash memory module as first blocks; reading out the groups of data from first blocks; executing error correction and de-randomize operation upon read out data to generate de-randomized data; executing randomize operation upon de-randomized data according to a set of seeds to generate randomized data; performing error code encoding upon randomized data to generate second corresponding parity check code; and, storing randomized data and second corresponding parity check code into flash memory module as second block; a cell of first block is used
(Continued)

for storing data of first bit number which is different from second bit number corresponding to a cell of second block.

18 Claims, 12 Drawing Sheets

Related U.S. Application Data continuation of application No. 16/841,688, filed on Apr. 7, 2020, now Pat. No. 11,030,042, which is a continuation of application No. 16/184,925, filed on Nov. 8, 2018, now Pat. No. 10,713,115, which is a continuation of application No. 15/997,674, filed on Jun. 4, 2018, now Pat. No. 10,157,098, which is a continuation of application No. 15/874,895, filed on Jan. 19, 2018, now Pat. No. 10,019,314, which is a continuation-in-part of application No. 15/497,185, filed on Apr. 25, 2017, now Pat. No. 9,910,772.

(60) Provisional application No. 62/328,025, filed on Apr. 27, 2016.

(51) Int. Cl.
   *G11C 29/52* (2006.01)
   *G11C 11/56* (2006.01)
   *G11C 16/26* (2006.01)
   *G11C 16/10* (2006.01)
   G11C 16/04 (2006.01)

(52) U.S. Cl.
   CPC ...... *G11C 11/5621* (2013.01); *G11C 11/5628* (2013.01); *G11C 11/5642* (2013.01); *G11C 16/10* (2013.01); *G11C 16/26* (2013.01); *G11C 29/52* (2013.01); G11C 16/0483 (2013.01); G11C 2211/5641 (2013.01)

(56) References Cited

U.S. PATENT DOCUMENTS

| | | | |
|---|---|---|---|
| 7,266,661 B2 | 9/2007 | Walmsley | |
| 7,710,777 B1 | 5/2010 | Montierth | |
| 8,131,920 B2 | 3/2012 | Hattori | |
| 8,327,066 B2 | 12/2012 | Heo | |
| 8,656,255 B1 | 2/2014 | Nemazie | |
| 8,792,277 B2 | 7/2014 | Eggleston | |
| 8,825,941 B2 | 9/2014 | Moshayedi | |
| 8,892,981 B2 | 11/2014 | Post | |
| 8,914,705 B1 | 12/2014 | Zeng | |
| 8,949,568 B2 | 2/2015 | Wei | |
| 8,972,776 B2 | 3/2015 | Baryudin | |
| 8,984,373 B2* | 3/2015 | Yang | G06F 11/1048 714/766 |
| 9,141,533 B2 | 9/2015 | Liao | |
| 9,286,985 B2 | 3/2016 | Kimura | |
| 9,432,298 B1 | 8/2016 | Smith | |
| 9,489,260 B1 | 11/2016 | Hong | |
| 9,685,242 B2 | 6/2017 | Sugiyama | |
| 9,734,911 B2 | 8/2017 | Sinclair | |
| 9,767,913 B2 | 9/2017 | Nagashima | |
| 10,015,152 B2 | 7/2018 | Resch | |
| 2001/0004326 A1 | 6/2001 | Terasaki | |
| 2001/0023472 A1 | 9/2001 | Kubushiro | |
| 2004/0156251 A1 | 8/2004 | Shiota | |
| 2006/0044880 A1 | 3/2006 | Naso | |
| 2006/0050314 A1 | 3/2006 | Shiga | |
| 2007/0019016 A1 | 1/2007 | Silverbrook | |
| 2008/0086676 A1 | 4/2008 | Mead | |
| 2008/0178061 A1 | 7/2008 | Mead | |
| 2008/0189466 A1 | 8/2008 | Hemmi | |
| 2008/0244356 A1 | 10/2008 | Bliss | |
| 2009/0241009 A1 | 9/2009 | Kong | |
| 2009/0316490 A1 | 12/2009 | Takada | |
| 2010/0077132 A1 | 3/2010 | Hung | |
| 2010/0138595 A1 | 6/2010 | Yoon | |
| 2010/0259983 A1 | 10/2010 | Yoon | |
| 2010/0332922 A1 | 12/2010 | Chang | |
| 2011/0066877 A1 | 3/2011 | Chen | |
| 2011/0191525 A1 | 8/2011 | Hsu | |
| 2011/0283166 A1 | 11/2011 | Kim | |
| 2011/0283167 A1 | 11/2011 | Bliss | |
| 2012/0005409 A1* | 1/2012 | Yang | G11C 16/10 711/E12.008 |
| 2012/0023283 A1 | 1/2012 | Yang | |
| 2012/0173920 A1 | 7/2012 | Park | |
| 2012/0213005 A1 | 8/2012 | Lee | |
| 2012/0246540 A1 | 9/2012 | Lee | |
| 2013/0117620 A1 | 5/2013 | Joo | |
| 2013/0297984 A1 | 11/2013 | Yamaga | |
| 2013/0322171 A1 | 12/2013 | Lee | |
| 2013/0329492 A1 | 12/2013 | Yang | |
| 2013/0332801 A1 | 12/2013 | Weng | |
| 2014/0026018 A1 | 1/2014 | Yang | |
| 2014/0032992 A1 | 1/2014 | Hara | |
| 2014/0068319 A1 | 3/2014 | Daly | |
| 2014/0101372 A1 | 4/2014 | Jung | |
| 2014/0129874 A1 | 5/2014 | Zaltsman | |
| 2014/0149828 A1 | 5/2014 | Chang | |
| 2014/0156966 A1 | 6/2014 | Ellis | |
| 2014/0185376 A1 | 7/2014 | Sinclair | |
| 2014/0204673 A1 | 7/2014 | Suzuki | |
| 2014/0226400 A1 | 8/2014 | Kimura | |
| 2014/0245105 A1 | 8/2014 | Chung | |
| 2014/0258769 A1 | 9/2014 | Baryudin | |
| 2014/0325124 A1 | 10/2014 | Antonakopoulos | |
| 2014/0380129 A1 | 12/2014 | Shin | |
| 2015/0058661 A1 | 2/2015 | Yang | |
| 2015/0058699 A1 | 2/2015 | Yang | |
| 2015/0058700 A1 | 2/2015 | Yang | |
| 2015/0067439 A1 | 3/2015 | Yamaki | |
| 2015/0078080 A1 | 3/2015 | Lee | |
| 2015/0117103 A1 | 4/2015 | Rhie | |
| 2015/0155975 A1 | 6/2015 | Baek | |
| 2015/0169402 A1 | 6/2015 | Wu | |
| 2015/0170747 A1 | 6/2015 | Liu | |
| 2015/0178149 A1 | 6/2015 | Cai | |
| 2015/0229337 A1 | 8/2015 | Alhussien | |
| 2015/0248328 A1 | 9/2015 | Yoon | |
| 2015/0255159 A1 | 9/2015 | Tanaka | |
| 2015/0293713 A1 | 10/2015 | Seo | |
| 2015/0347229 A1 | 12/2015 | Higgins | |
| 2015/0370491 A1 | 12/2015 | Cheon | |
| 2016/0041760 A1 | 2/2016 | Kuang | |
| 2016/0062827 A1 | 3/2016 | Yamauchi | |
| 2016/0062829 A1 | 3/2016 | Harasawa | |
| 2016/0071604 A1 | 3/2016 | Kurita | |
| 2016/0098319 A1 | 4/2016 | Gorobets | |
| 2016/0104539 A1 | 4/2016 | Kim | |
| 2016/0110102 A1 | 4/2016 | Lee | |
| 2016/0110249 A1 | 4/2016 | Orme | |
| 2016/0110252 A1 | 4/2016 | Hyun | |
| 2016/0260489 A1 | 9/2016 | Lee | |
| 2016/0306553 A1 | 10/2016 | Ellis | |
| 2016/0313931 A1 | 10/2016 | Song | |
| 2016/0321202 A1 | 11/2016 | Catherwood | |
| 2016/0342345 A1 | 11/2016 | Kankani | |
| 2017/0031751 A1 | 2/2017 | Baek | |
| 2017/0046225 A1 | 2/2017 | Yang | |
| 2017/0060425 A1 | 3/2017 | Sunata | |
| 2017/0315908 A1 | 11/2017 | Yang | |
| 2017/0317693 A1 | 11/2017 | Yang | |
| 2018/0018091 A1 | 1/2018 | Shin | |
| 2018/0246783 A1 | 8/2018 | Avraham | |
| 2018/0246821 A1 | 8/2018 | Kanno | |
| 2018/0342301 A1 | 11/2018 | Shen | |

FOREIGN PATENT DOCUMENTS

| | | |
|---|---|---|
| CN | 101281492 A | 10/2008 |
| CN | 101593156 A | 12/2009 |
| CN | 101727976 A | 6/2010 |

(56) References Cited

FOREIGN PATENT DOCUMENTS

| | | |
|---|---|---|
| CN | 101946239 A | 1/2011 |
| CN | 102033814 A | 4/2011 |
| CN | 102110481 A | 6/2011 |
| CN | 102150216 A | 8/2011 |
| CN | 102236585 A | 11/2011 |
| CN | 102623055 A | 8/2012 |
| CN | 103038830 A | 4/2013 |
| CN | 103093818 A | 5/2013 |
| CN | 103325417 A | 9/2013 |
| CN | 103473146 A | 12/2013 |
| CN | 103514101 A | 1/2014 |
| CN | 103544073 A | 1/2014 |
| CN | 103733175 A | 4/2014 |
| CN | 104205059 A | 12/2014 |
| CN | 104282340 A | 1/2015 |
| CN | 104750571 A | 7/2015 |
| CN | 104750615 A | 7/2015 |
| CN | 104850514 A | 8/2015 |
| CN | 104991738 A | 10/2015 |
| CN | 105009215 A | 10/2015 |
| CN | 105279115 A | 1/2016 |
| CN | 105280238 A | 1/2016 |
| CN | 105513638 A | 4/2016 |
| CN | 104835526 A | 8/2016 |
| CN | 106409344 A | 2/2017 |
| CN | 106504796 A | 3/2017 |
| TW | M369528 U1 | 11/2009 |
| TW | 201508758 A | 3/2015 |
| TW | 201535114 A | 9/2015 |
| TW | 201545161 A | 12/2015 |
| TW | 201603047 A | 1/2016 |
| TW | 201612908 A | 4/2016 |

OTHER PUBLICATIONS

Myeongwoon Jeon et al., Limited magnitude error locating parity check codes for flash memories, 2012 IEEE 55th International Midwest Symposium on Circuits and Systems (MWSCAS), p. 29-32 ,Sep. 5, 2012.

Yaakobi et al., "Error Characterization and Coding Schemes for Flash Memories", IEEE Globecom 2010 Workshop on Application of Communication Theory to Emerging Memory Technologies, 2010, pp. 1856-1860.

\* cited by examiner

|  | CH# | CH0 | | CH0 | | CH1 | | CH1 | |
|---|---|---|---|---|---|---|---|---|---|
|  | CE# | CE0 | | CE1 | | CE0 | | CE1 | |
|  |  | PLN0 | PLN1 | PLN0 | PLN1 | PLN0 | PLN1 | PLN0 | PLN1 |
| First group | WL0 | P1 | P2 | P3 | P4 | P5 | P6 | P7 | P8 |
| | WL1 | P9 | P10 | P11 | P12 | P13 | P14 | P15 | P16 |
| | WL2 | P17 | P18 | P19 | P20 | P21 | P22 | P23 | P24 |
| Second group | WL3 | P1 | P2 | P3 | P4 | P5 | P6 | P7 | P8 |
| | WL4 | P9 | P10 | P11 | P12 | P13 | P14 | P15 | P16 |
| | WL5 | P17 | P18 | P19 | P20 | P21 | P22 | P23 | P24 |
| Third group | WL6 | P25 | P26 | P27 | P28 | P29 | P30 | P31 | P32 |
| | WL7 | P33 | P34 | P35 | P36 | P37 | P38 | P39 | P40 |
| | WL8 | P41 | P42 | P43 | P44 | P45 | P46 | P47 | P48 |
| Fourth group | WL9 | | | | | | | | |
| | WL10 | | | | | | | | |
| | WL11 | | | | | | | | |
| ⋮ | | | | | | | | | |
| Antepenult group | WL120 | | | | | | | | |
| | WL121 | | | | | | | | |
| | WL122 | | | | | | | | |
| Penultimate group | WL123 | | | | | | | | |
| | WL124 | | | | | | | | |
| | WL125 | | | | | | | ///205/// | /////// |
| Last group | WL126 | | | | | | | | |
| | WL127 | | | | | | | ////// | ///210/// |

FIG. 2

|  |  |  | CH0 | | CH0 | | CH1 | | CH1 | |
|  |  |  | CE0 | | CE1 | | CE0 | | CE1 | |
|  |  |  | PLN0 | PLN1 | PLN0 | PLN1 | PLN0 | PLN1 | PLN0 | PLN1 |
| WL0 | LSB | WL0 | | | | | | | | |
| | CSB | WL1 | | | | | | | | |
| | MSB | WL2 | | | | | | | | |
| WL1 | LSB | WL3 | | | | | | | | |
| | CSB | WL4 | | | | | | | | |
| | MSB | WL5 | | | | | | | | |
| WL2 | LSB | WL6 | | | | | | | | |
| | CSB | WL7 | | | | | | | | |
| | MSB | WL8 | | | | | | | | |

FIG. 3

|  |  |  | CH0 | | CH0 | | CH1 | | CH1 | |
|---|---|---|---|---|---|---|---|---|---|---|
|  |  |  | CE0 | | CE1 | | CE0 | | CE1 | |
|  |  |  | PLN0 | PLN1 | PLN0 | PLN1 | PLN0 | PLN1 | PLN0 | PLN1 |
| WL0 | LSB | WL0 |  |  | ▨ |  |  |  |  |  |
|  | CSB | WL1 |  |  | ▨ |  |  |  |  |  |
|  | MSB | WL2 |  |  | ▨ |  |  |  |  |  |
| WL1 | LSB | WL3 |  |  | ▨ |  |  |  |  |  |
|  | CSB | WL4 |  |  | ▨ |  |  |  |  |  |
|  | MSB | WL5 |  |  | ▨ |  |  |  |  |  |
| WL41 | LSB | WL0 |  |  |  |  |  |  |  |  |
|  | CSB | WL1 |  |  |  |  |  |  |  |  |
|  | MSB | WL2 |  |  |  |  |  | ▨ | ▨ | ▨ |
| WL42 | LSB | WL3 |  |  |  |  |  |  |  |  |
|  | CSB | WL4 |  |  |  |  |  | ▨ | ▨ | ▨ |
|  | MSB | WL5 |  |  |  |  |  |  |  |  |
| WL43 | LSB | WL0 | ▨ |  |  |  |  |  |  |  |
|  | CSB | WL1 | ▨ |  |  |  |  |  |  |  |
|  | MSB | WL2 | ▨ |  |  |  |  |  |  |  |
| WL44 | LSB | WL3 | ▨ |  |  |  |  |  |  |  |
|  | CSB | WL4 | ▨ |  |  |  |  |  |  |  |
|  | MSB | WL5 | ▨ |  |  |  |  |  |  |  |
| WL84 | LSB | WL124 |  |  |  |  |  |  |  |  |
|  | CSB | WL125 |  |  |  |  |  | ▨ | ▨ | ▨ |
|  | MSB | WL126 |  |  |  |  |  |  |  |  |
| WL85 | LSB | WL127 |  |  |  |  |  | ▨ | ▨ | ▨ |
|  | CSB | WL0 |  |  |  |  |  |  |  |  |
|  | MSB | WL1 |  |  |  |  |  |  |  |  |
| WL125 | LSB | WL119 |  |  |  |  |  |  | ▨ |  |
|  | CSB | WL120 |  |  |  |  |  |  | ▨ |  |
|  | MSB | WL121 |  |  |  |  |  |  | ▨ |  |
| WL126 | LSB | WL122 |  |  |  |  |  |  | ▨ |  |
|  | CSB | WL123 |  |  |  |  |  |  | ▨ |  |
|  | MSB | WL124 |  |  |  |  |  |  | ▨ |  |
| WL127 | LSB | WL125 |  |  |  |  |  | ▨ | ▨ | ▨ |
|  | CSB | WL126 |  |  |  |  |  |  |  |  |
|  | MSB | WL127 |  |  |  |  |  | ▨ | ▨ | ▨ |

FIG. 4

| | CH# | CH0 | | CH0 | | CH1 | | CH1 | |
|---|---|---|---|---|---|---|---|---|---|
| | CE# | CE0 | | CE1 | | CE0 | | CE1 | |
| | | PLN0 | PLN1 | PLN0 | PLN1 | PLN0 | PLN1 | PLN0 | PLN1 |
| First group | WL0 | P1 | P2 | P3 | P4 | P5 | P6 | P7 | P8 |
| | WL1 | P9 | P10 | P11 | P12 | P13 | P14 | P15 | P16 |
| | WL2 | P17 | P18 | P19 | P20 | P21 | P22 | P23 | P24 |
| Second group | WL3 | P1 | P2 | P3 | P4 | P5 | P6 | P7 | P8 |
| | WL4 | P9 | P10 | P11 | P12 | P13 | P14 | P15 | P16 |
| | WL5 | P17 | P18 | P19 | P20 | P21 | P22 | P23 | P24 |
| Third group | WL6 | P25 | P26 | P27 | P28 | P29 | P30 | P31 | P32 |
| | WL7 | P33 | P34 | P35 | P36 | P37 | P38 | P39 | P40 |
| | WL8 | P41 | P42 | P43 | P44 | P45 | P46 | P47 | P48 |
| Fourth group | WL9 | | | | | | | | |
| | WL10 | | | | | | | | |
| | WL11 | | | | | | | | |
| ⋮ | ⋮ | | | | | | | | |
| Antepenult group | WL120 | | | | | | | | |
| | WL121 | | | | | | | | |
| | WL122 | | | | | | | | ▨ |
| Penultimate group | WL123 | | | | | | | | ▨ |
| | WL124 | | | | | | | | ▨ |
| | WL125 | | | | | | | | ▨ |
| Last group | WL126 | | | | | | | | ▨ |
| | WL127 | | | | | | | | ▨ |

FIG. 5

|  | Data page address | | | |
|---|---|---|---|---|
| WL_G0 (WL0~WL3) Lower data page | P0L | P1L | P2L | P3L |
| Middle data page | P0M | P1M | P2M | P3M |
| Upper data page | P0U | P1U | P2U | P3U |
| WL_G1 (WL4~WL7) Lower data page | P4L | P5L | P6L | P7L |
| Middle data page | P4M | P5M | P6M | P7M |
| Upper data page | P4U | P5U | P6U | P7U |

⋮

| | | | | |
|---|---|---|---|---|
| WL_G47 Lower data page | P188L | P189L | P190L | P191L |
| Middle data page | P188M | P189M | P190M | P191M |
| Upper data page | P188U | P189U | P190U | P191U |

FIG. 13

FLASH MEMORY APPARATUS AND STORAGE MANAGEMENT METHOD FOR FLASH MEMORY

CROSS REFERENCE TO RELATED APPLICATIONS

This application is a continuation application of U.S. application Ser. No. 17/242,326, filed on Apr. 28, 2021, which is a continuation application of U.S. application Ser. No. 16/841,688, filed on Apr. 7, 2020, which is a continuation application of U.S. application Ser. No. 16/184,925, filed on Nov. 8, 2018, which is a continuation application of U.S. application Ser. No. 15/997,674, filed on Jun. 4, 2018, which is a continuation application of U.S. application Ser. No. 15/874,895, filed on Jan. 19, 2018, which is a continuation-in-part of U.S. application Ser. No. 15/497,185, filed on Apr. 25, 2017, which claims the benefit of U.S. Provisional Application No. 62/328,025, filed on Apr. 27, 2016. The contents of these applications are incorporated herein by reference.

BACKGROUND OF THE INVENTION

1. Field of the Invention

The invention relates to a flash memory apparatus, and more particularly to a flash memory apparatus and a corresponding storage management method for performing RAID-like (Redundant Array of Independent Disks-like) error correction code (ECC) encoding operation.

2. Description of the Prior Art

Generally speaking, when performing data programming to program data into a single-level-cell (SLC) block or a multiple-level-cell (MLC) block, a conventional flash memory controller is usually arranged to program corresponding parity check codes of other data pages of a word line of a data block into the last data page of the word line, so that the conventional controller can use the corresponding parity check codes to correct errors with a certain degree of error correction capability when program failure, word line open, or word line short occurs. However, the utilization rate of a flash memory space inevitably becomes lower. For example, if one word line includes eight data pages, the conventional controller is arranged to program data into seven data pages and program parity check codes into one data page. That is, it is necessary to use one eighth of memory space of a data block for storing parity check codes. The one eighth of memory space cannot be used to store data. This poor user experience is usually cannot be accepted for users.

SUMMARY OF THE INVENTION

Therefore one of the objectives of the invention is to provide a flash memory apparatus and corresponding flash memory storage management method for adopting an RAID-like (Redundant Array of Independent Disks-like) error code encoding operation, to reduce error rates, reduce number of necessary parity check codes, and to appropriately program the necessary parity check codes into corresponding memory locations of data pages, so as to be able to use the parity check codes to perform error correction when program failure, word line open, and word line short occurs, to solve the problems mentioned above.

In addition, the invention is also to provide a process which classifies data to be programmed into a plurality of groups of data, respectively executes error code encoding to generate a corresponding parity check code to program the groups of data and the corresponding parity check code to a plurality of first blocks and then reads out and reprograms data read from the plurality of first blocks into at least one second block after completing program of the plurality of first blocks.

According to embodiments of the invention, a flash memory apparatus is disclosed. The flash memory apparatus comprises a flash memory module and a flash memory controller. The flash memory module comprises a plurality of storage blocks, and a cell of each storage block can be used for storing data of 1 bit or data of at least 2 bits. The flash memory controller is configured for classifying data to be programmed into a plurality of groups of data, respectively executing error code encoding to generate a first corresponding parity check code to store the groups of data and the first corresponding parity check code into the flash memory module as first blocks, reading out the groups of data from the first blocks, executing error correction and de-randomize operation upon read out data to generate de-randomized data, executing randomize operation upon the de-randomized data according to a set of seeds to generate randomized data, performing error code encoding upon the randomized data to generate a second corresponding parity check code, and storing the randomized data and the second corresponding parity check code into the flash memory module as a second block. A cell of a first block is used for storing data of a first bit number which is different from a second bit number, and a cell of the second block is arranged for storing data of the second bit number.

According to the embodiments, a flash memory storage management method used for a flash memory module having a plurality of storage blocks is disclosed. A cell of each storage block can be used for storing data of 1 bit or data of at least 2 bits, and the flash memory storage management method comprises: classifying data to be programmed into a plurality of groups of data; respectively executing error code encoding to generate a first corresponding parity check code to store the groups of data and the first corresponding parity check code into the flash memory module as first blocks; reading out the groups of data from the first blocks; executing error correction and de-randomize operation upon read out data to generate de-randomized data; executing randomize operation upon the de-randomized data according to a set of seeds to generate randomized data; performing error code encoding upon the randomized data to generate a second corresponding parity check code; and storing the randomized data and the second corresponding parity check code into the flash memory module as a second block. A cell of a first block is used for storing data of a first bit number which is different from a second bit number, and a cell of the second block is arranged for storing data of the second bit number.

According to the embodiments, a flash memory controller connected to a flash memory module having a plurality of storage blocks is disclosed. A cell of each storage block can be used for storing data of 1 bit or data of at least 2 bits. The flash memory controller is configured for classifying data to be programmed into a plurality of groups of data, respectively executing error code encoding to generate a first corresponding parity check code to store the groups of data and the first corresponding parity check code into the flash memory module as first blocks. The flash memory controller comprises a decoding circuit, a de-randomizer, a randomizer, and an encoding circuit. The decoding circuit is configured for executing error correction upon read out data which is read out by the flash memory controller from the first blocks. The de-randomizer is coupled to the decoding circuit and configured for performing a de-randomize operation upon the read out data to generate de-randomized data. The randomizer is coupled to the de-randomizer and configured for executing a randomize operation upon the de-randomized data according to a set of seeds to generate randomized data. The encoding circuit is coupled to the randomizer and configured for performing the error code encoding upon the randomized data to generate a second corresponding parity check code. The flash memory controller is arranged for storing the randomized data and the second corresponding parity check code into the flash memory module as a second block. A cell of a first block is used for storing data of a first bit number which is different from a second bit number, and a cell of the second block is arranged for storing data of the second bit number.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a diagram illustrating one SLC programming executed by the flash memory controller of FIG. 1 to program a particular group of data into an SLC block of flash memory module according to a first embodiment of the invention.

FIG. 3 is a diagram illustrating data programming from one SLC block within flash memory module to the TLC block via the internal copy operation.

FIG. 4 is a diagram illustrating an embodiment of flash memory controller in FIG. 1 programming/writing three groups of data into multiple SLC blocks within flash memory module and moving the data into the TLC block via the internal copy operation to form a super block.

FIG. 5 is a diagram illustrating one SLC programming executed by the flash memory controller of FIG. 1 to program a particular group of data into an SLC block of flash memory module according to a second embodiment of the invention.

FIG. 13 is a diagram illustrating multiple word line sets in one block.

DETAILED DESCRIPTION

Figure 1:
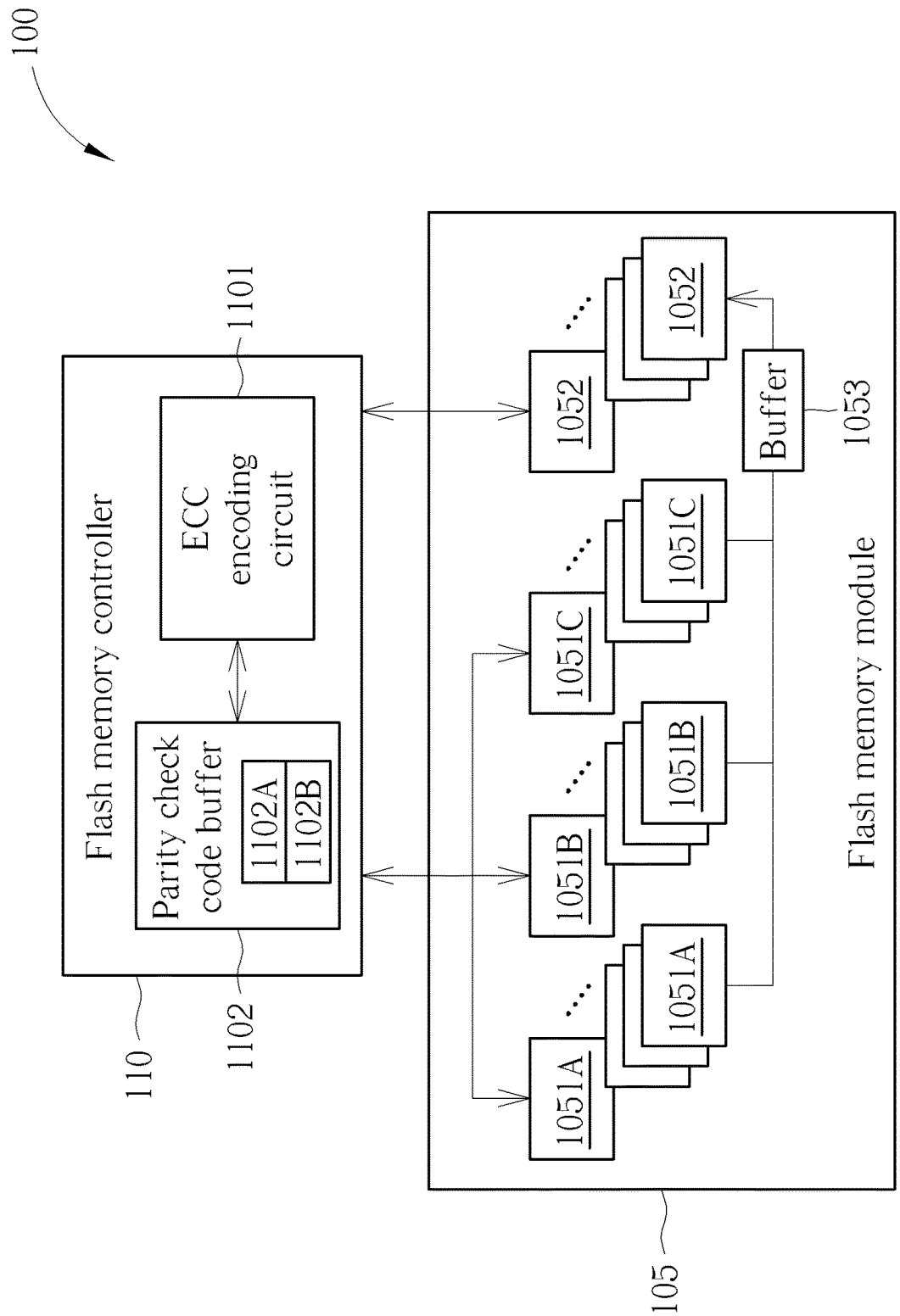
FIG. 1 is a device diagram of a flash memory apparatus according to an embodiment of the invention.

Please refer to FIG. 1, which is a device diagram of a flash memory apparatus 100 according to an embodiment of the invention. The flash memory apparatus 100 comprises a flash memory module 105 and a flash memory controller 110. The flash memory module 105 is a flash memory module having a two-dimensional plane structure; however, this is not meant to be a limitation of the invention. The flash memory module 105 comprises multiple flash memory chips (not shown in FIG. 1) and each flash memory chip includes multiple storage blocks wherein the storage block(s) may be used as first block(s) or second block(s). A cell/unit of a first block is arranged for storing data of 1 bit (i.e. two states of one bit), and a cell/unit of a second block is arranged for storing data of N bits, i.e., $2^N$ states, wherein N is an integer equal to or greater than 1. In one embodiment, the first block may be used as a single-level-cell (SLC) block, and the second block may be used as a multiple-level-cell block. The multiple-level-cell block for example includes units of a multi-level cell (MLC) block which can be used for storing data of 2 bits (i.e. 4 states), units of a triple-level cell (TLC) block which can be used for storing data of 3 bits (i.e. 8 states), and/or units of a quad-level cell (QLC) block which can be used for storing data of 4 bits (16 states), and so on. Typically, the memory cells in the flash memory module 105 have the same or similar physical structure. The memory cells can be arranged as SLC, MLC, or TLC blocks under the control of the flash memory controller 110. The following descriptions mainly illustrate the SLC, MLC, or TLC blocks for brevity. Please note that the flash memory controller 110 can arrange a part of the memory cells in a block as SLC cells and a part of the memory cells in the same block as MLC cells (or TLC cells). It is not a limitation to arrange all cells of a block as the same cell (e.g. all SLC cells).

The flash memory controller 110 can be arranged to employ various kinds of programming schemes to control and program a storage block as the first block (e.g. so called SLC block) having cells each for storing data of two states of one bit or as the second block (e.g. so called MLC block or TLC block) having cells each for storing data of $2^N$ states of N bits. Corresponding embodiments are detailed in the following paragraphs.

Figure 7:
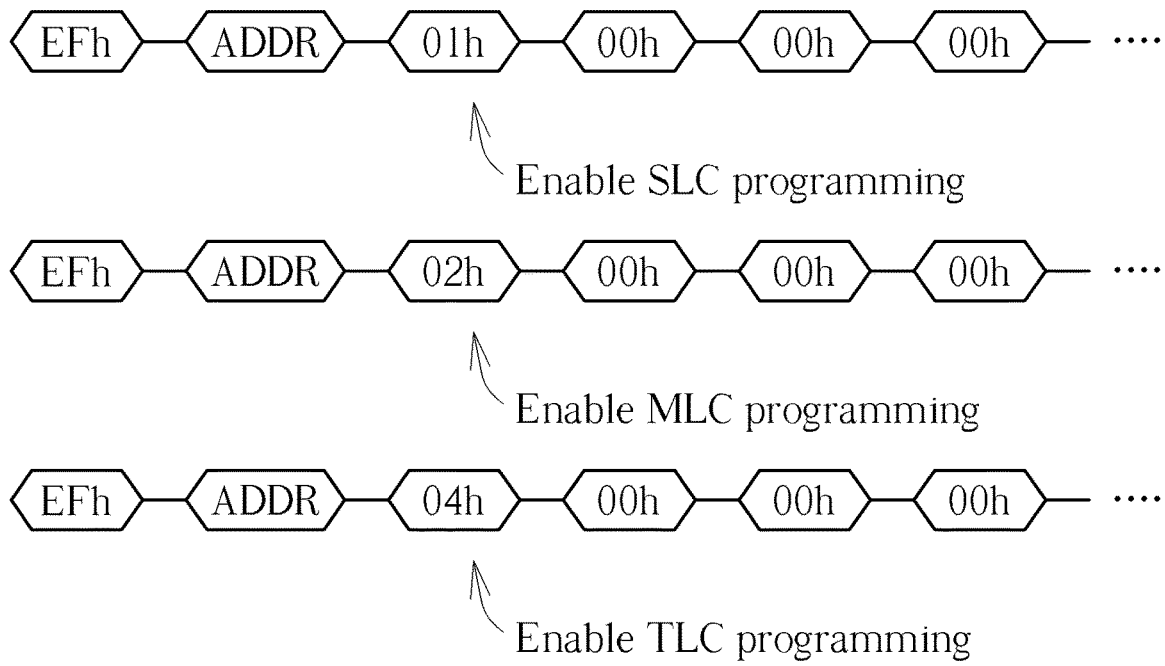
FIG. 7 is a timing diagram showing a command sequence sent from the flash memory controller to the flash memory module according to a first command sequence embodiment of the invention.

Refer to FIG. 7. FIG. 7 is a timing diagram showing a command sequence sent from the flash memory controller 110 to the flash memory module 105 according to a first command sequence embodiment of the invention. As shown in FIG. 7, when the flash memory controller 110 determines to control one or more blocks within flash memory module 105 as first blocks(s) such as SLC block(s) having cells for storing data of two states of 1 bit (i.e. bits '0' and '1'), the flash memory controller 110 is arranged to send a SET FEATURES ('EFh') command sequence to the module 105. For example, the flash memory controller 110 may sequentially send the SET FEATURES command 'EFh', the address 'ADDR' of a control register within a chip/die of the module 105, and the values to be written into the control register '01h', '00h', '00h', '00h' (total 32 bytes but not limited), so as to enable SLC programming operation; the address 'ADDR' of the control register may be '91h' (but not limited). That is, after this, such chip/die equivalently enters an SLC mode/state, and the flash memory controller 110 can treat one or more blocks of such chip/die as SLC block(s) and perform SLC programming upon such SLC block(s) if such chip/die does not exit the SLC mode/state.

Alternatively, when the flash memory controller 110 determines to control one or more blocks within flash memory module 105 as second blocks(s) such as multi-level-cell (MLC) block(s) having cells for storing data of 4 states of 2 bits (i.e. bits '00', '01', '10', '11'), the flash memory controller 110 is also arranged to send the SET FEATURES ('EFh') command sequence to the module 105. For example, the flash memory controller 110 may sequentially send the SET FEATURES command 'EFh', the address of the control register within the chip/die of the module 105, the values to be written into the control register '02h', '00h', '00h', '00h' (total 32 bytes but not limited), so as to enable MLC programming operation. That is, after this, such chip/die equivalently enters an MLC mode/state, and the flash memory controller 110 can treat one or more blocks of such chip/die as MLC block(s) and perform MLC programming upon such MLC block(s) if such chip/die does not exit the MLC mode/state.

Alternatively, when the flash memory controller 110 determines to control one or more blocks within flash memory module 105 as second blocks (s) such as TLC block(s) having cells for storing data of $2^3$ states of 3 bits (i.e. bits '000', '001', '010', '011', '100', '101', '110', and '111'), the flash memory controller 110 is also arranged to send the SET FEATURES ('EFh') command sequence to the module 105. For example, the flash memory controller 110 may sequentially send the SET FEATURES command 'EFh', the address of the control register within the chip/die of the module 105, the values to be written into the control register '04h', '00h', '00h', '00h' (total 32 bytes but not limited), so as to enable TLC programming operation. That is, after this, such chip/die equivalently enters a TLC mode/state, and the flash memory controller 110 can treat one or more blocks of such chip/die as TLC block(s) and perform TLC programming upon such MLC block(s) if such chip/die does not exit the TLC mode/state.

Figure 8:
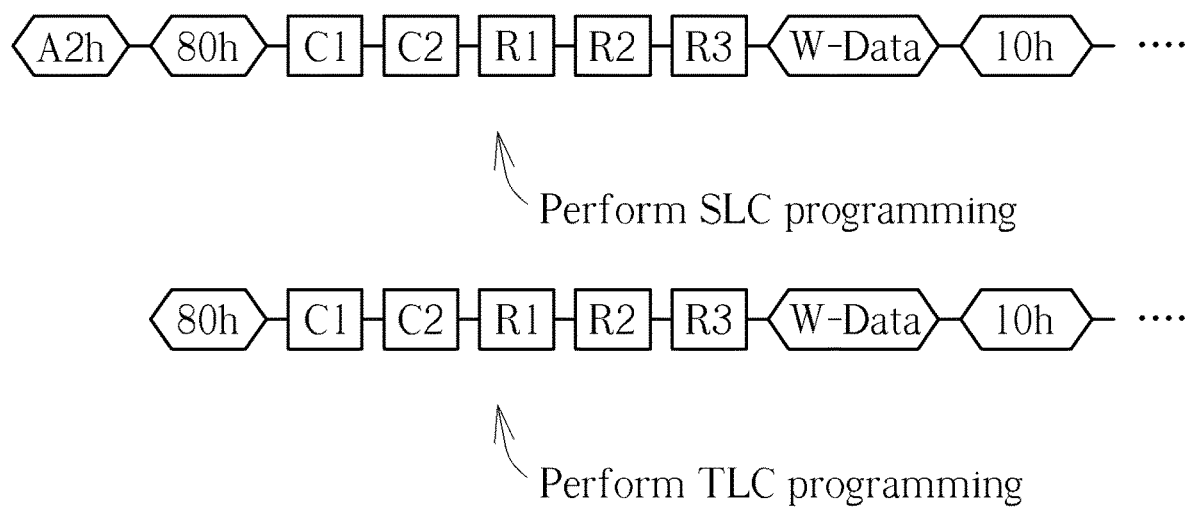
FIG. 8 is a timing diagram showing a command sequence sent from the flash memory controller to the flash memory module according to a second command sequence embodiment of the invention.

Refer to FIG. 8. FIG. 8 is a timing diagram showing a command sequence sent from the flash memory controller 110 to the flash memory module 105 according to a second command sequence embodiment of the invention. The default setting is that the flash memory controller 110 treats a block as the second block (i.e. the multiple-level-cell block) such as a TLC block and programs data into such TLC block. In this situation, the flash memory controller 110 is arranged to sequentially send the start of programming command '80h' (8 bytes), information of the address to be programed which is indicated by C1, C2, R1, R2, R3 (total 40 bytes but not limited), data to be programed 'W-Data', and the end of programming command '10h' (8 bytes). If receiving this kind of command sequence, the flash memory module 105 knows that such block is programmed as a TLC block, e.g. the blocks 1052.

Alternatively, when the flash memory controller 110 determines to use a block within flash memory module 105 as a first block such as an SLC block, the flash memory controller 110 is arranged to send a specific command/prefix such as 'A2h' (8 bytes) before sending the start of programming command '80h'. That is, the flash memory controller 110 is arranged to sequentially send the specific command/prefix 'A2h', the start of programming command '80h' (8 bytes), information of the address to be programed which is indicated by C1, C2, R1, R2, R3 (total 40 bytes but not limited), data to be programed 'W-Data', and the end of programming command '10h' (8 bytes). If receiving this kind of command sequence, the flash memory module 105 knows that such block is programmed as an SLC block, e.g. the blocks 1051A, 1051B, and 1051C. In other words, in this embodiment, the flash memory controller 110 is arranged to further send the specific command 'A2h' each time before sending the start of programming command '80h' to notify the module 105 to program a block which is used as the SLC block. The flash memory controller 110 does not send the specific command 'A2h' if the controller 110 is arranged to notify the module 105 to program a block which is used as the TLC block. In addition, it should be noted that the specific command 'A2h' is similarly used in reading a block used as the SLC block and/or erasing the SLC block. In addition, it should be noted that in other embodiments the specific command/prefix 'A2h' may be placed in the middle between '80h' and '10h' to notify the module 105 of a block will be programmed as an SLC block.

Figure 9:
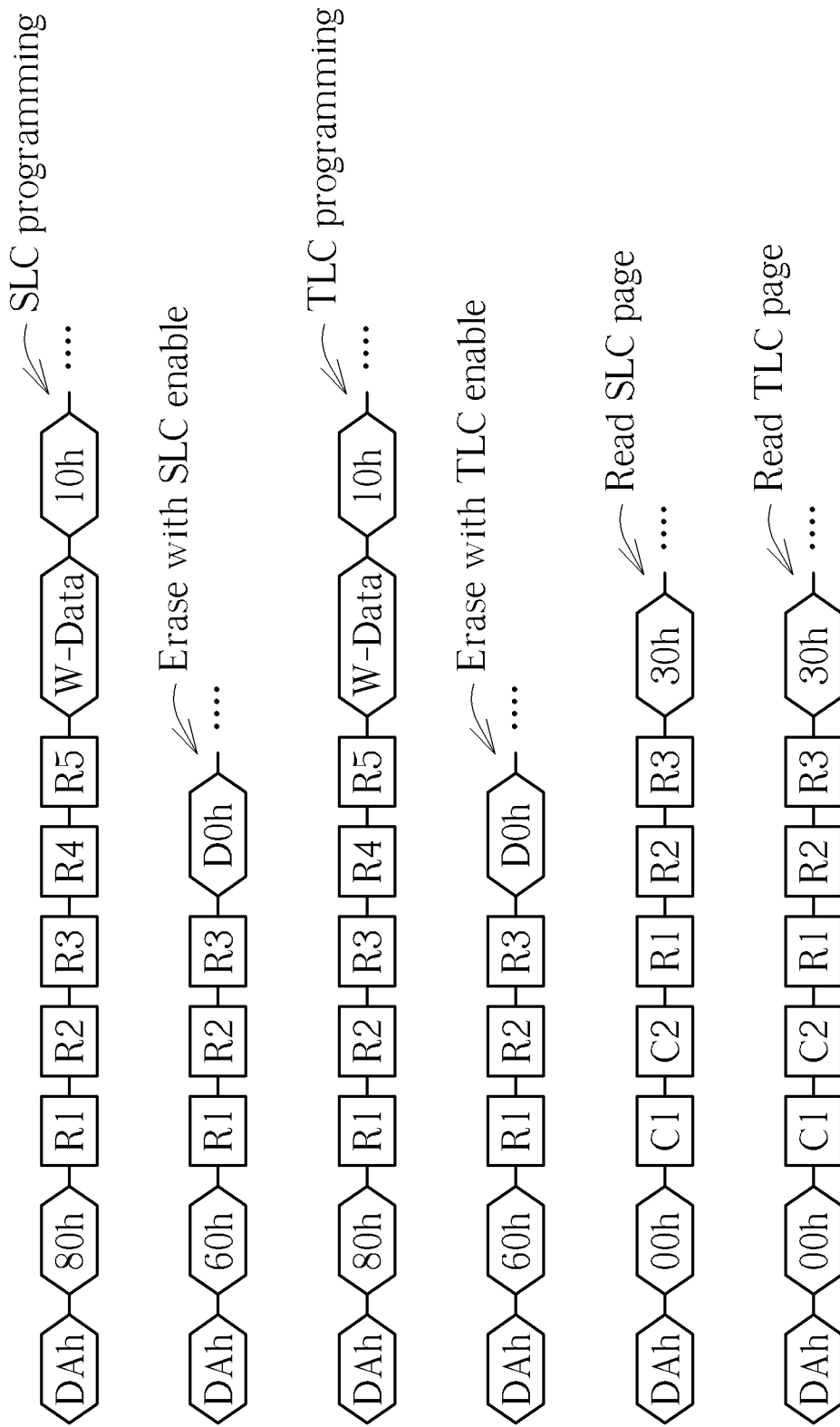
FIG. 9 is a timing diagram showing a command sequence sent from the flash memory controller to the flash memory module according to a third command sequence embodiment of the invention.

Refer to FIG. 9. FIG. 9 is a timing diagram showing a command sequence sent from the flash memory controller 110 to the flash memory module 105 according to a third command sequence embodiment of the invention. The default setting is that the flash memory controller 110 treats a block as the second block (i.e. the multiple-level-cell block) such as a TLC block and programs data into such TLC block. The flash memory controller 110 can be arranged to send a specific command/prefix 'DAh' to enable SLC mode programming of a block and send another command/prefix 'DFh' to disable SLC mode programming of a block. The command/prefix 'DAh' can be placed/added in the front of an erase command, a read command, or a programming command, and the command/prefix 'DFh' can be placed/added in the front of an erase command, a read command, or a programming command.

For example, when the flash memory controller 110 determines to use a block within flash memory module 105 as a first block such as an SLC block as well as performs programming, the flash memory controller 110 is arranged to sequentially send the specific command/prefix 'DAh', the start of programming command '80h' (8 bytes), information of the address to be programed which is indicated by R1-R5 (total 40 bytes but not limited), the data to be programed 'W-Data', and the end of programming command '10h' (8 bytes). After this, the flash memory module 105 equivalently enters an SLC mode, and the controller 110 treats block(s) of flash memory module 105 as SLC block(s) and performs SLC programming upon such blocks if the module 105 does not exit the SLC mode. Additionally, for example, the flash memory controller 110 can be arranged to perform a block erase operation with SLC mode enable operation by sequentially sending the specific command/prefix 'DAh', the start of erase command '60h', information of the address to be erased programed which is indicated by R1-R3, and the end of erase command 'D0h'. After this erase operation, the flash memory module 105 equivalently enters the SLC mode, and the controller 110 treats block(s) of flash memory module 105 as SLC block(s) and performs SLC programming upon such blocks if the module 105 does not exit the SLC mode. Further, for example, the flash memory controller 110 can be arranged to perform an SLC page read operation by sequentially sending the specific command/prefix 'DAh', the start of read command '00h', information of the address to be read which is indicated by C1, C2, R1-R3, and the end of read command '30h'.

Alternatively, when the flash memory controller 110 determines to use block(s) within flash memory module 105 as second block(s) such as TLC block(s), the flash memory controller 110 is arranged to send the command/prefix 'DFh' to disable SLC programming. For example, the flash memory controller 110 is arranged to sequentially send the specific command/prefix 'DFh', the start of programming command '80h' (8 bytes), information of the address to be programed which is indicated by R1-R5 (total 40 bytes but not limited), and the end of programming command '10h' (8 bytes). After this, the flash memory module 105 equivalently enters a TLC mode, and the controller 110 treats block(s) of flash memory module 105 as TLC block(s) and performs TLC programming upon such blocks if the module 105 does not exit the TLC mode. Additionally, for example, the flash memory controller 110 can be arranged to perform a block erase operation with TLC mode enable operation by sequentially sending the specific command/prefix 'DFh', the start of erase command '60h', information of the address to be erased programed which is indicated by R1-R3, and the end of erase command 'D0h'. After this erase operation, the flash memory module 105 equivalently enters the TLC mode, and the controller 110 treats block(s) of flash memory module 105 as TLC block(s) and performs SLC programming upon such blocks if the module 105 does not exit the TLC mode. Further, for example, the flash memory controller 110 can be arranged to perform a TLC page read operation by sequentially sending the specific command/prefix 'DFh', the start of read command '00h', information of the address to be read which is indicated by C1, C2, R1-R3, and the end of read command '30h'.

The flash memory controller 110 is connected to the flash memory module 105 via a plurality of channels. The flash memory controller 110 can use the different channels to simultaneously program data into different flash memory chips to improve the efficiency of data programming. The flash memory controller 110 includes an error correction code (ECC) encoding circuit 1101 and a parity check code buffer 1102. The ECC encoding circuit 1101 is arranged to perform ECC encoding operation upon data. For example, in the embodiments, the ECC encoding operation comprises Reed-Solomon (RS) codes encoding operation and/or exclusive-OR (XOR) encoding operation for generating corresponding parity check codes respectively. The parity check code buffer 1102 is used for temporarily storing the generated corresponding parity check codes. The flash memory controller 110 is arranged for programming data into different flash memory chips by employing an RAID-like (Redundant Array of Independent Disks-like) memory management mechanism to reduce data error rate and referring to storage locations (storage locations of SLC block(s) and storage locations of TLC block(s)) of parity check codes generated by different encoding operations when programming data into SLC block(s) so that data errors can be corrected when programming data into SLC block(s) and also can be corrected when the flash memory module 105 performs an internal copy operation to copy and move data from SLC block(s) to a TLC block.

In practice, in order to improve the efficiency of data programming and reduce the data error rate, the flash memory module 105 is designed to include multiple channels (for example two channels in this embodiment but is not limited). When a channel is used by the controller 110 to program a certain data page, the controller 110 can use another channel to program another data page without waiting for the former channel. Each channel corresponds to respective sequencer in the controller 110 and corresponds to multiple flash memory chips (for example two chips in this embodiment but is not limited). Thus, one channel can be to perform data programming simultaneously for different data pages of multiple flash memory chips without waiting for completion of one chip. In addition, each flash memory chip includes a folded design including two different planes, and different data pages of two blocks respectively located on the two different planes can be programmed simultaneously without waiting for completion of data programming of one block when programming data into one flash memory chip. One super block of the flash memory module 105 is composed by multiple data pages of multiple flash memory chips of multiple channels. The flash memory controller 110 is arranged to program data by super blocks. The flash memory controller 110 programs data to SLC blocks within the flash memory module 105, and the programmed data are buffered by the SLC blocks. Then, the programmed data is copied and programmed to a TLC block from the SLC blocks. It should be noted that in other embodiments each flash memory chip may not comprise the folded design, and one data page of one block is programmed when programming data into one flash memory chip. It is required to wait for some times for programming data to other data pages.

For the flow of data programming, data is programmed by the flash memory controller 110 to multiple SLC blocks 1051A-1051C, and then the programmed data is moved from the SLC blocks 1051A-1051C to the multiple-level-cell block 1052 such as the TLC block including TLC units for storing information of $2^3$ states of 3 bits in this embodiment; the programed data is moved into the buffer 1053 and then is moved from the buffer 1053 to the multiple-level-cell block 1052 such as TLC block, and commands of the data move operations can be issued by the flash memory controller 110. That is, data of the three SLC blocks 1051A-1051C is programmed into one TLC block 1052. To perform error correction protection for data programming of SLC blocks 1051A-1051C and data programming of the TLC block 1052, the flash memory controller 110 is arranged for classifying the data into three groups of data. It should be noted that the flash memory controller 110 is arranged for classifying the data into two groups of data if the multiple-level-cell block for example includes MLC units which can be used for storing data of $2^2$ states of 2 bits. The flash memory controller 110 is arranged for classifying the data into four groups of data if the multiple-level-cell block for example includes QLC units which can be used for storing data of $2^4$ states of 4 bits. That is, the units of multiple-level-cell block 1052 are used for storing information of $2^N$ states of N bits wherein N is an integer which is equal to or greater than 2, and the number of SLC blocks is designed as N. The flash memory controller 110 is arranged to classify data to be programmed into N groups of data to respectively program the data into N SLC blocks.

In this embodiment, after classifying the data as three groups of data, the flash memory controller 110 is arranged to execute a first SLC program to program the first group of data into the first SLC block 1051A and use the ECC coding circuit 1101 to generate corresponding parity check codes and write the corresponding parity check codes into the first SLC block 1051A. In this way, the data program of the SLC block 1051A is completed. Then, the flash memory controller 110 is arranged to execute the second SLC program to program the second group of data into the second SLC block 1051B and use the ECC coding circuit 1101 to generate corresponding parity check codes and write the corresponding parity check codes into the second SLC block 1051B. In this way, the data program of the SLC block 1051B is completed. The flash memory controller 110 then is arranged to execute the third SLC program to program the third group of data into the third SLC block 1051C and use the ECC coding circuit 1101 to generate corresponding parity check codes and write the corresponding parity check codes into the third SLC block 1051C. In this way, the data program of the third SLC block 1051C is completed.

When the flash memory controller 110 performs SLC program to write a particular group of data into a particular SLC block or after programming the particular SLC block has been completed, the flash memory controller 110 is arranged to detect whether there are data errors. If data errors exist, for example program fail, one word line open, and/or two word line short occurs when programming a particular SLC block, the flash memory controller 110 is arranged for correcting the data errors by using corresponding parity check codes generated by the ECC encoding circuit 1101 when programming the particular SLC block.

When programming the above three groups of data into the three SLC blocks 1051A-1051C or programming a particular SLC block has been completed, the flash memory module 105 is arranged for performing internal copy operation by copying and moving the three groups of data from the three SLC blocks 1051A-1051C to the TLC block 1052 or copying and moving the particular group of data from the particular SLC block to the TLC block 1052 and then performing TLC programming to write the data into the TLC block 1052 (i.e. the above-mentioned super block) according to the order of the three groups of data. The TLC block 1052 is composed by data pages of word lines of different flash memory chips of different channels. A data page of a word line of the TLC block 1052 for example includes an upper page, a middle page, and a lower page. The internal copy operation of flash memory module 105 for example is used to program/write multiple data pages of the (N)th word line of an SLC block into multiple upper pages of a word line of the TLC block 1052, to program/write multiple data pages of the (N+1)th word line of the SLC block into multiple middle pages of the same word line of the TLC block 1052, and to program/write multiple data pages of the (N+2)th word line of the SLC block into multiple lower pages of the same word line of the TLC block 1052, sequentially. After all the three groups of data have been programed into the TLC block 1052, the program operation for the super block is completed.

It should be noted that, to easily implement the internal copy operation, meet the requirement of randomizer seed rules of TLC block 1052, and reduce the data error rate according to the ECC encoding capability, the internal copy operation is arranged to move data from SLC blocks into locations of upper, middle, and lower pages of multiple word lines if the TLC block 1052 according to the order of the data, and the flash memory controller 110 is arranged to program/write the different groups of data and generated corresponding parity check codes into the SLC blocks 1051A-1051C according to the requirement of randomizer seed rules of TLC block 1052 and storage locations of parity check codes of ECC encoding. Thus, the ECC capability of ECC encoding circuit 1101 can be arranged to correct the errors which are resulted from program failure, one word line open and/or two word line short of an SLC block when programming the SLC block, and can be also arranged to correct the errors which are resulted from program failure, one word line open and/or two word line short of TLC block 1052 when programming the TLC block 1052.

In addition, if the flash memory module 105 performs memory garbage collection, the flash memory controller 110 can externally read out and retrieve data from the SLC blocks 1051A-1051C and/or from the TLC block 1052 to re-perform ECC encoding to execute SLC programming again. In addition, if performing SLC programming to write data into an SLC block and shutdown occurs, the flash memory controller 110 is arranged to read back data from the SLC block and re-encode and re-perform ECC encoding and SLC programming the read back data into another SLC block. In addition, if performing TLC programming to write data into the TLC block 1052 and shutdown occurs, the flash memory module 105 is arranged to discard data currently stored by the TLC block 1052 and perform the internal copy operation to copy and program corresponding data from the SLC blocks 1051A-1051C into TLC block 1052

Please refer to FIG. 2, which is a diagram illustrating one SLC programming executed by the flash memory controller 110 of FIG. 1 to program a particular group of data into an SLC block of flash memory module 105 according to a first embodiment of the invention. The ECC encoding circuit 1101 of flash memory controller 110 is arranged to perform RAID-like RS (Reed Solomon) encoding operation upon data to generate corresponding parity check codes, and the parity check code buffer 1102 is used for temporarily storing the generated parity check codes.

The flash memory module 105 includes two channels and two flash memory chips in which two sets of blocks of each chip include two different planes. To improve the efficiency of data programming, the flash memory controller 110 is arranged for respectively programming/writing data via the two channels into two different blocks of the two flash memory chips within flash memory module 105. As shown in FIG. 2, in this embodiment, one SLC block for example includes (128) word lines which are respectively represented by WL0-WL127. The SLC block can be composed by only one SLC block or one set of sub-blocks of the SLC block, and depends on different definitions of SLC block in different embodiments. In this embodiment, one SLC block is composed by a set of (128) word lines each for example including (8) data pages. For the first word line WL0 of the SLC block, the flash memory controller 110 programs/writes the data pages P1 and P2 into the flash memory chip CE0 via channel CH0 and folded planes PLN0 and PLN1, then programs/writes the data pages P3 and P4 into another flash memory chip CE1 via the same channel CH0 and folded planes PLN0 and PLN1, then programs/writes the data pages P5 and P6 into the flash memory chip CE0 via another channel CH1 and folded planes PLN0 and PLN1, and then programs/writes the data pages P7 and P8 into the flash memory chip CE1 via the channel CH1 and folded planes PLN0 and PLN1; other and so on.

The flash memory controller 110 sequentially classifies every (M) word lines among the multiple word lines WL0-WL127 of an SLC block as one group of data wherein the number (M) is an integer which is equal to or greater than two. For example, M is equal to three. Word lines WL0-WL2 are classified into the first group of data. Word lines WL3-WL5 are classified into the second group of data. Word lines WL6-WL8 are classified into the third group of data. Word lines WL9-WL11 are classified into the fourth group of data, and other so on. Word lines WL120-WL122 are classified into a third group of data which is inversely counted, i.e. an antepenult group. Word lines WL123-WL125 are classified into a second group of data which is inversely counted, i.e. a penultimate group. Word lines WL126-WL127 are classified into the last/final group of data. The first, third, fifth groups of word lines and so on are odd groups of word lines, and the second, fourth, sixth groups of word lines and so on are even groups of word lines. When each time programming/writing one group of word line data (including data of three word lines), the flash memory controller 110 is arranged to use the ECC encoding circuit 1101 to execute ECC encoding upon the group of word line data to generate and output corresponding partial parity check codes to the parity check code buffer 1102 for buffering the partial parity check codes.

For buffering the partial parity check codes, the parity check code buffer 1102 is arranged to store partial parity check codes corresponding to odd groups of word line data in a first buffer area 1102A and to store partial parity check codes corresponding to even groups of word line data in a second buffer area 1102B. For example, when programming/writing data pages P1-P24 of word lines WL0-WL2, the ECC encoding circuit 1101 performs ECC encoding upon data of the data pages P1-P24 and then outputs generated partial parity check codes to the parity check code buffer 1102 and buffer the generated partial parity check codes in the first buffer area 1102A. When programming/writing data pages P1-P24 of word lines WL3-WL5, the ECC encoding circuit 1101 performs ECC encoding upon data of the data pages P1-P24 and then outputs generated partial parity check codes to the parity check code buffer 1102 and buffer the generated partial parity check codes in the second buffer area 1102B. When programming/writing data pages P25-P48 of word lines WL6-WL8, the ECC encoding circuit 1101 performs ECC encoding upon data of the data pages P25-P48 and then outputs generated partial parity check codes to the parity check code buffer 1102 and buffer the generated partial parity check codes in the first buffer area 1102A. The ECC encoding operation and buffer operation are performed similarly for other data pages. When programming/writing data pages of word lines WL120-WL122, the ECC encoding circuit 1101 performs ECC encoding upon data of the data pages of word lines WL120-WL122 and then outputs generated partial parity check codes to the parity check code buffer 1102 and buffer the generated partial parity check codes in the first buffer area 1102A.

When programming/writing the last group of word lines (WL123-WL125) among even groups of word lines, in addition to performing SLC programming and corresponding ECC encoding operation, the flash memory controller 110 is also arranged to read back partial parity check codes corresponding to all data of even groups of word lines data buffered by the second buffer area 1102B, and to write/program all parity check codes (all partial parity check codes) corresponding to even groups of word line data into data pages of the last word line WL125 of the last group of word lines among the even groups of word lines. For instance, the all partial parity check codes, i.e. RS parity check codes corresponding to data of even groups of word lines, are programmed to the last three data pages as marked by 205 on FIG. 2.

Additionally, in addition to performing SLC programming and corresponding ECC encoding operation, when programming the last word line WL127 of the last group among the odd groups of data, the flash memory controller 110 is arranged to read back partial parity check codes corresponding to all odd groups of data, i.e. a portion of all parity check codes, from the first buffer area 1102A. The flash memory controller 110 then programs/writes all parity check codes corresponding to the odd groups of data into the data pages such as the last three data pages marked by 210 of the last word line WL127 of the last odd group of word lines, to store RS parity check codes corresponding to data of all the odd groups of word lines. After this, programming for one SLC block is completed. With respect to RS encoding operation, the parity check codes corresponding to data of the odd groups of word lines are stored/programed to the last data pages of the last word line WL127 of the last group among the odd groups of word lines. The parity check codes corresponding to data of the even groups of word lines are stored/programed to the last data pages of the last word line WL125 of the last group among the even groups of word lines.

In addition, as shown by the embodiment of FIG. 2, the ECC encoding circuit 1101 performs the ECC encoding operation such as an RS code encoding operation capable of correcting error(s) of any three data pages of one SLC block. For example, the ECC encoding circuit 1101 performs the ECC encoding operation upon data of the three word lines WL0-WL2 to generate corresponding partial parity check codes. If data errors result from three data pages, e.g. data pages P1, P9, and P17, of the same folded plane of the same chip of the same channel, the ECC encoding circuit 1101 can use the generated partial parity check codes to correct data errors of the three data pages.

The flash memory controller 110 may detect program fail when programming/writing one SLC block. For example, if the controller 110 detects program fail of a data page such as P9, the ECC encoding circuit 1101 can use corresponding partial parity check codes to correct errors of the data page P9.

The flash memory controller 110 may detect one word line open when programming/writing one SLC block. For example, if the controller 110 detects one word line open of a data page such as P9, the ECC encoding circuit 1101 can use the corresponding partial parity check codes to correct errors of the data page P9.

The flash memory controller 110 may detect two word line short when programming/writing one SLC block. For example, if the controller 110 detects data errors of two data pages such as P9 and P17 resulting from two word line short of the two data pages, the ECC encoding circuit 1101 can use the corresponding partial parity check codes to correct errors of the two data pages P9 and P17. If the controller 110 detects data errors of two data pages such as P17 of word line WL2 and P1 of the word line WL3 resulting from two word line short of the two data pages, the ECC encoding circuit 1101 can use partial parity check codes of one group of word lines WL0-WL2 and partial parity check codes of another group of word lines WL3-WL5 to respectively correct data errors of page P17 of word line WL2 and page P1 of word line WL3. If the controller 110 detects data errors of two data pages such as P1 and P2 of word line WL0 resulting from two word line short of the two data pages, the ECC encoding circuit 1101 can use partial parity check codes of one group of word lines WL0-WL2 to respectively correct data errors of pages P1 and P2 of word line WL0.

Therefore, the ECC encoding circuit 1101 can correspondingly correct data page errors resulting from program fail, one word line open or two word line short when performing programming of one SLC block.

Please refer to FIG. 3, which is a diagram illustrating data programming from one SLC block within flash memory module 105 to the TLC block 1052 via the internal copy operation. As shown by FIG. 3, data of a group of three word lines within one SLC block is programed to one word line within TLC block 1052, to correspondingly form a least important bit (LSB) portion, a central important bit (CSB) portion, and a most important bit (MSB) portion of one data page of the word line within TLC block 1052. For instance, data of word lines WL0-WL2 of the SLC block is respectively programed to the LSB portion, CSB portion, and MSB portion of word line WL0 of TLC block 1052. Data of word lines WL3-WL5 of the SLC block is respectively programed to the LSB portion, CSB portion, and MSB portion of word line WL1 of TLC block 1052. Data of word lines WL6-WL8 of the SLC block is respectively programed to the LSB portion, CSB portion, and MSB portion of word line WL2 of TLC block 1052. That is, the internal copy operation of flash memory module 105 is used to move and program data of one SLC block into partial word lines of the TLC block by the sequence of word lines of the SLC block.

Please refer to FIG. 4, which is a diagram illustrating an embodiment of flash memory controller 110 in FIG. 1 programming/writing three groups of data into multiple SLC blocks 1051A-1051C within flash memory module 105 and moving the data into the TLC block via the internal copy operation to form a super block. The ECC encoding circuit 1101 is arranged to separate data into odd groups of word line data and even groups of word line data each time when performing programming of SLC block(s), and is arranged to respectively store generated parity check codes at the last three data pages of the last word line of the odd groups of word lines and the last three data pages of the last word line of the even groups of word lines. When module 105 performs programming of TLC block, as shown in FIG. 4, the parity check codes corresponding to the first group among the odd groups of word lines are programed and stored to the last three data pages, marked by 401A, of the CSB portions of word line WL42 of the super block. The parity check codes corresponding to the first group among the even groups of word lines are programed and stored to the last three data pages, marked by 401B, of the MSB portions of word line WL41 of the super block. The parity check codes corresponding to the second group among the odd groups of word lines are programed and stored to the last three data pages (marked by 402A) of the LSB portions of word line WL85 of the super block. The parity check codes corresponding to the second group among the even groups of word lines are programed and stored to the last three data pages, marked by 402B, of the MSB portions of word line WL84 of the super block. The parity check codes corresponding to the third group among the odd groups of word lines are programed and stored to the last three data pages, marked by 403A, of the MSB portions of word line WL127 of the super block. The parity check codes corresponding to the third group among the even groups of word lines are programed and stored to the last three data pages, marked by 403B, of the LSB portions of word line WL127 of the super block.

If detecting data errors resulting from two word line short and occurring at two data pages (marked by 404) of word lines WL0 and WL1 of the super block, the flash memory module 105 is capable of correcting the errors occurring at the data page of word line WL0 by using the parity check codes 401A stored at the three data pages of the CSB portions of word line WL42, and is also capable of correcting the errors occurring at the data page of word line WL1 by using the parity check codes 401B stored at the three data pages of the MSB portions of word line WL41.

Similarly, if detecting data errors resulting from two word line short and occurring at two data pages (marked by 405) of word lines WL43 and WL44 of the super block, the flash memory module 105 is capable of correcting the errors occurring at the LSB and CSB portions of one data page of word line WL43 and MSB portion of one data page of word line WL44 (as marked by 405) by using the parity check codes 402A stored at the LSB portions of the last three data pages of word line WL85, and is also capable of correcting the errors occurring at the MSB portion of one data page of word line WL 43 and LSB and CSB portions of one data page of word line WL44 (as marked by 405) by using the parity check codes 402B stored at the CSB portions of the last three data pages of word line WL84.

Similarly, if detecting data errors resulting from two word line short and occurring at two data pages (marked by 406) of word lines WL125 and WL126 of the TLC block, the flash memory module 105 is capable of correcting the errors occurring at the CSB and MSB portions of one data page of word line WL125 and MSB portion of one data page of word line WL126 (as marked by 406) by using the parity check codes 403A stored at the MSB portions of the last three data pages of word line WL127, and is also capable of correcting the errors occurring at the LSB portion of one data page of word line WL125 and CSB and MSB portions of one data page of word line WL126 (as marked by 406) by using the parity check codes 403B stored at the LSB portions of the last three data pages of word line WL127.

If detecting data errors resulting from one word line open or program fail and occurring at any one data page of any one word line of the super block (i.e. errors occurring at any three consecutive subpages), the flash memory module 105 is also capable of correcting errors occurring at any three consecutive subpages by using corresponding parity check codes.

According to the storage management mechanism for using flash memory controller 110 to program/write three groups of data and corresponding parity check codes into SLC blocks 1051A-1051C within flash memory module 105, when the flash memory module 105 uses the internal copy operation to sequentially program/write the data from SLC blocks 1051A-1051C into the TLC block to form a super block, the flash memory module 105 can perform error correction by using the parity check codes stored at the SLC blocks 1051A-1051C if detecting the errors resulting from one word line open, two word line short or program fail.

Please refer to FIG. 5, which is a diagram illustrating one SLC programming executed by the flash memory controller 110 of FIG. 1 to program a particular group of data into an SLC block of flash memory module 105 according to a second embodiment of the invention. The ECC encoding circuit 1101 of flash memory controller 110 is arranged to perform RAID-like XOR (exclusive-OR) encoding operation upon data to generate corresponding parity check codes, and the parity check code buffer 1102 is used for temporarily storing the generated parity check codes. In addition, the XOR operation of ECC encoding circuit 1101 includes three different encoding engines to respectively perform XOR operations upon different word line data of SLC block(s). The description is detailed in the following paragraphs.

The flash memory module 105 includes two channels and two flash memory chips. To improve the efficiency of data programming, the flash memory controller 110 is arranged for respectively programming/writing data via the two channels into the two flash memory chips within flash memory module 105, to respectively program data pages of one SLC block into different flash memory chips. In this embodiment, an SLC block of one SLC block data programming executed by flash memory controller 110 for example includes (128) word lines which are respectively represented by WL0-WL127. Each word line includes/has eight data pages. For example, regarding word line WL0, the ECC encoding circuit 1101 programs/writes data pages P1 and P2 into flash memory chip CE0 by using the channel CH0 and planes PLN0 and PLN1, and then programs/writes data pages P3 and P4 into another flash memory chip CE1 by using the same channel CH0 and planes PLN0 and PLN1. The ECC encoding circuit 1101 then programs/writes data pages P5 and P6 into flash memory chip CE0 by using the channel CH1 and planes PLN0 and PLN1, and programs/writes data pages P7 and P8 into another flash memory chip CE1 by using the channel CH1 and planes PLN0 and PLN1; other and so on.

The ECC encoding circuit 1101 of flash memory controller 110 sequentially classifies every (M) word lines among the multiple word lines WL0-WL127 of an SLC block into one group of word lines wherein the number (M) is an integer which is equal to or greater than two. For example, M is equal to three. For example, word lines WL0-WL2 are classified into the first group. Word lines WL3-WL5 are classified into the second group. Word lines WL6-WL8 are classified into the third group. Word lines WL9-WL11 are classified into the fourth group, and other so on. Word lines WL120-WL122 are classified into a third group which is inversely counted, i.e. an antepenult group. Word lines WL123-WL125 are classified into a second group which is inversely counted, i.e. a penultimate group. Word lines WL126-WL127 are classified into the final group (the last group). The first, third, fifth groups and so on are odd groups of word lines, and the second, fourth, sixth groups and so on are even groups of word lines. When each time programming/writing one group of word line data (including data of three word lines), the flash memory controller 110 is arranged to use the ECC encoding circuit 1101 to execute/perform ECC encoding operation upon such group of word line data to generate and output corresponding partial parity check codes to the parity check code buffer 1102 for buffering the partial parity check codes.

When each time programming/writing data to one group of three word lines, the ECC encoding circuit 1101 is arranged for employing three different encoding engines to perform exclusive-OR (XOR) encoding operations upon the data to be programed and thus generate and output corresponding partial parity check codes into the parity check code buffer 1102 for buffering the partial parity check codes. The parity check code buffer 1102 is arranged for storing/buffering the partial parity check codes corresponding to the odd groups of word line data in a first buffer area, and for storing/buffering the partial parity check codes corresponding to the even groups of word line data in a second buffer area.

For instance, the ECC encoding circuit 1101 includes a first encoding engine, a second encoding engine, and a third encoding engine. When programming the data pages P1-P24 of word lines WL0-WL2, the ECC encoding circuit 1101 uses the first encoding engine to execute XOR operation upon data pages P1-P8 of the word line WL0 to generate a first partial parity check code, uses the second encoding engine to execute XOR operation upon data pages P9-P16 of the word line WL1 to generate a second partial parity check code, and then uses the third encoding engine to execute XOR operation upon data pages P17-P24 of the word line WL2 to generate a third partial parity check code. The ECC encoding circuit 1101 respectively outputs the generated partial parity check codes to the parity check code buffer 1102, to buffer the generated partial parity check codes in the first buffer area. When programming data pages P1-P24 of the word lines WL3-WL5, the ECC encoding circuit 1101 uses the first encoding engine to execute XOR operation upon data pages P1-P8 of the word line WL3 to generate another first partial parity check code, uses the second encoding engine to execute XOR operation upon data pages P9-P16 of the word line WL4 to generate another second partial parity check code, and then uses the third encoding engine to execute XOR operation upon data pages P17-P24 of the word line WL5 to generate another third partial parity check code. The ECC encoding circuit 1101 respectively outputs the generated partial parity check codes to the parity check code buffer 1102, to buffer the generated partial parity check codes in the second buffer area.

Programming and encoding operations for other data pages are similar. That is, for data of the first, second, and third word lines of one group among the odd groups of word lines and for data of the first, second, and third word lines of one group among the even groups of word lines, the ECC encoding circuit 1101 is arranged for performing/executing different XOR operations to respectively generate corresponding parity check codes. To write/program the corresponding parity check codes into appropriate storage locations of SLC block(s), the ECC encoding circuit 1101 is arranged to write/program the corresponding parity check codes into last data pages (as shown by the rectangle with slanted lines in FIG. 5) of last six word lines WL122-WL127 when programming data pages of the last six word lines WL122-WL127. For instance, when programming data pages of the word line WL122 which is a third word line of one group among the odd groups of word lines, the ECC encoding circuit 1101 programs/writes parity check codes corresponding to all third word lines among all odd groups of word lines into the last/final data page of the word line WL122 wherein the parity check codes corresponding to all the third word lines are all the third partial parity check codes generated by the third encoding engine for the odd groups of word lines. For instance, when programming data pages of the word line WL123 which is a first word line of one group among the even groups of word lines, the ECC encoding circuit 1101 programs/writes parity check codes corresponding to all first word lines among all even groups of word lines into the last/final data page of the word line WL123 wherein the parity check codes corresponding to all the first word lines are all the first partial parity check codes generated by the first encoding engine for the even groups of word lines. For instance, when programming data pages of the word line WL124 which is a second word line of one group among the even groups of word lines, the ECC encoding circuit 1101 programs/writes parity check codes corresponding to all second word lines among all even groups of word lines into the last/final data page of the word line WL124 wherein the parity check codes corresponding to all the second word lines are all the second partial parity check codes generated by the second encoding engine for the even groups of word lines.

For instance, when programming data pages of the word line WL125 which is a third word line of the last group among the even groups of word lines, the ECC encoding circuit 1101 programs/writes parity check codes corresponding to all third word lines among all even groups of word lines into the last/final data page of the word line WL125 wherein the parity check codes corresponding to all the third word lines are all the third partial parity check codes generated by the third encoding engine for the even groups of word lines.

For instance, when programming data pages of the word line WL126 which is a first word line of the last group among the odd groups of word lines, the ECC encoding circuit 1101 programs/writes parity check codes corresponding to all first word lines among all odd groups of word lines into the last/final data page of the word line WL126 wherein the parity check codes corresponding to all the first word lines are all the first partial parity check codes generated by the first encoding engine for the odd groups of word lines.

For instance, when programming data pages of the word line WL127 which is a second word line of the last group among the odd groups of word lines, the ECC encoding circuit 1101 programs/writes parity check codes corresponding to all second word lines among all odd groups of word lines into the last/final data page of the word line WL127 wherein the parity check codes corresponding to all the second word lines are all the second partial parity check codes generated by the second encoding engine for the odd groups of word lines. Thus, data programming of one SLC block is completed.

That is, when programming data into one SLC block, the flash memory controller 110 is arranged for sequentially classifies every (M) word lines among all the word lines of the SLC block into one group of word lines to generate odd groups of word lines and even groups of word lines and for respectively performing (M) times of different XOR encoding operations upon each word line of each odd group and each word line of each even group to generate (M) partial parity check codes corresponding to each word line of the odd groups and (M) partial parity check codes corresponding to each word line of the even groups. The flash memory controller 110 then programs/writes the (M) partial parity check codes corresponding to each word line of the odd groups into the last/final data pages of last (M) word lines among the odd groups of word lines and programs/writes the (M) partial parity check codes corresponding to each word line of the even groups into the last/final data pages of last (M) word lines among the even groups of word lines. For example, M is equal to three in this embodiment but is not meant to be a limitation of the invention.

The ECC encoding circuit 1101 as shown in the embodiment of FIG. 5 is arranged to perform XOR encoding operations which is capable of correcting errors occurring in any one data page of one word line of one SLC block. For example, when performing data programming of one SLC block, if detecting data errors resulting from program fail and occurring at a data page such as page P9 of word line WL1, the ECC encoding circuit 1101 can use other correct data pages P10-P16 of the same word line WL1 and corresponding partial parity check code (s) generated by the second encoding engine when processing the word line WL1 of the first group, to correct the errors occurring at the data page P9.

For example, when performing data programming of one SLC block, if detecting data errors resulting from one word line open and occurring at a data page such as page P9 of word line WL1, the ECC encoding circuit 1101 can also use other correct data pages P10-P16 of the same word line WL1 and corresponding partial parity check code (s) generated by the second encoding engine when processing the word line WL1 of the first group, to correct the errors occurring at the data page P9.

For example, when performing data programming of one SLC block, if detecting data errors resulting from two word line short and occurring at two data pages such as page P9 of word line WL1 and page P17 of word line WL2, the ECC encoding circuit 1101 can use other correct data pages P10-P16 of the word line WL1 and corresponding partial parity check code (s) generated by the second encoding engine when processing the word line WL1 of the first group, to correct the errors occurring at the data page P9. In addition, the ECC encoding circuit 1101 can use other correct data pages P18-P24 of the word line WL2 and corresponding partial parity check code(s) generated by the third encoding engine when processing the word line WL2 of the first group, to correct the errors occurring at the data page P17 of word line WL2.

If detecting data errors resulting from two word line short and occurring at two data pages such as page P17 of word line WL2 and page P1 of word line WL3, the ECC encoding circuit 1101 can use other correct data pages P18-P24 of the word line WL2 and corresponding partial parity check code(s) generated by the third encoding engine when processing the word line WL2 of the first group, to correct the errors occurring at the data page P17 of word line WL2. In addition, the ECC encoding circuit 1101 can use other correct data pages P2-P8 of the word line WL3 and corresponding partial parity check code (s) generated by the first encoding engine when processing the word line WL3 of the second group, to correct the errors occurring at the data page P1 of word line WL3.

Thus, whether data page errors resulting from program fail, one word line open or two word line short occur when one SLC block is programed, the ECC encoding circuit 1101 is able to correct the data page errors correspondingly. The internal copy operation of flash memory module 105 for programming data from the above-mentioned SLC blocks into the TLC block is similarly to the internal copy operation of the embodiment of FIG. 3, and is not detailed for brevity.

Figure 6:
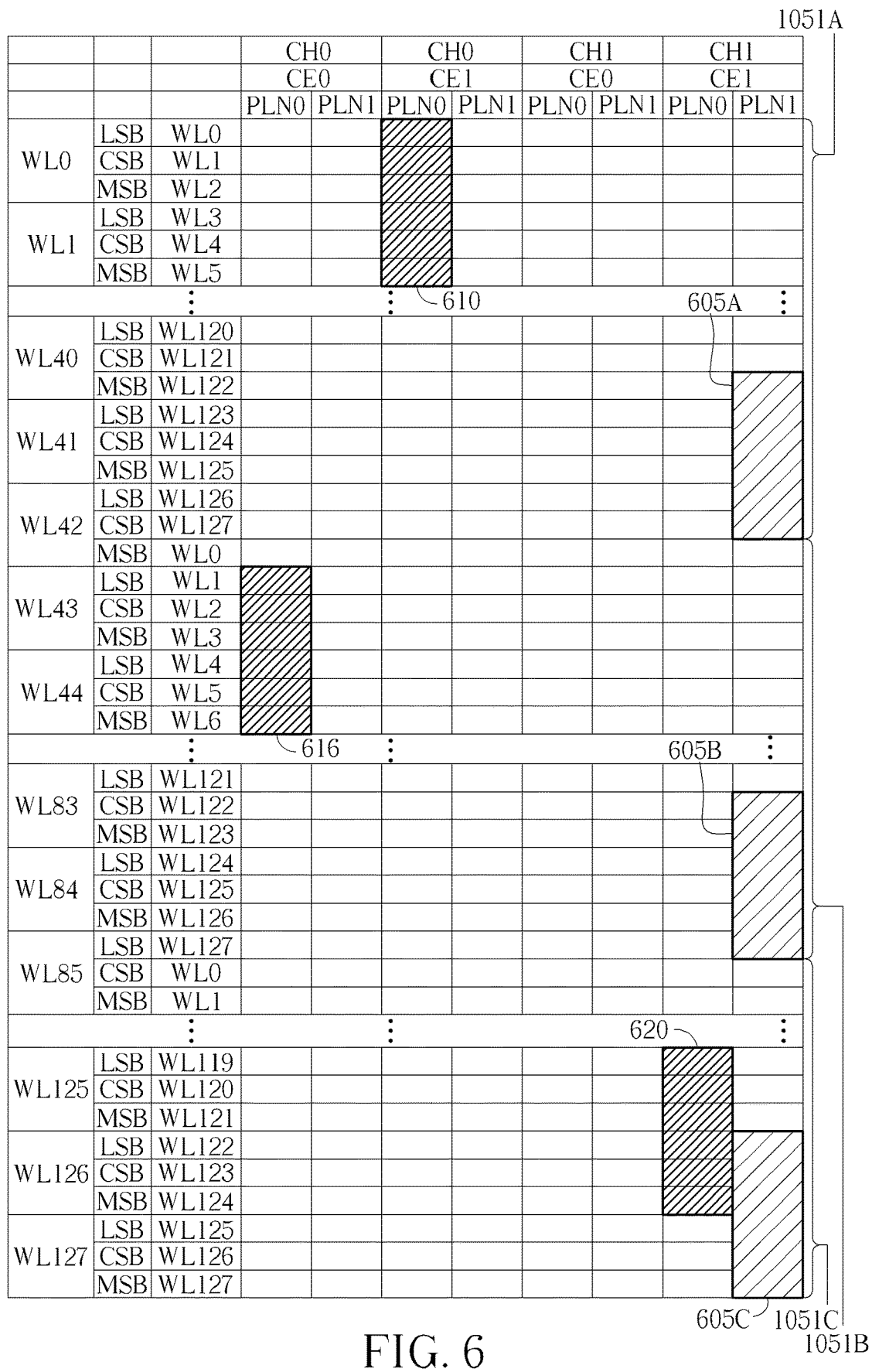
FIG. 6 is a diagram illustrating a second embodiment of flash memory controller in FIG. 1 programming/writing three groups of data into multiple SLC blocks within flash memory module and moving the data into the TLC block via the internal copy operation to form a super block.

Please refer to FIG. 6, which is a diagram illustrating a second embodiment of flash memory controller 110 in FIG. 1 programming/writing three groups of data into multiple SLC blocks 1051A-1051C within flash memory module 105 and moving the data into the TLC block via the internal copy operation to form a super block. The ECC encoding circuit 1101 is arranged to separate data into odd groups of word line data and even groups of word line data each time when performing programming of SLC block(s), and is arranged to respectively store generated parity check codes at each last data page of the last three word lines of the odd groups and each last data page of the last three word lines of the even groups. When module 105 performs programming of TLC block, as shown in FIG. 6 and marked by 605A, the parity check codes corresponding to a first set of word lines are programed and stored to the MSB portion of the last data page of word line WL40, last data page of word line WL41, and LSB and CSB portions of the last data page of word line WL42 within the TLC block 1052. Specifically, parity check codes corresponding to odd groups of word lines of SLC block(s) belonging to the first set are stored at the MSB portion of the last data page of word line WL40 and LSB and CSB portions of the last data page of word line WL42. Parity check codes corresponding to even groups of word lines of SLC block(s) belonging to the first set are stored at the LSB, CSB, and MSB portions of the last data page of word line WL41.

As marked by 605B, the parity check codes corresponding to a second set of word lines are programed and stored to the CSB and MSB portions of the last data page of word line WL83, last data page of word line WL84, and LSB portion of the last data page of word line WL85 within the TLC block 1052. Specifically, for parity check codes corresponding to odd groups of word lines of SLC block(s) belonging to the second set, all the third partial parity check codes generated by the third encoding engine are stored at the CSB portion of the last data page of word line WL83 of TLC block 1052; all the first partial parity check codes generated by the first encoding engine are stored at the MSB portion of the last data page of word line WL84 of TLC block 1052; all the second partial parity check codes generated by the second encoding engine are stored at the LSB portion of the last data page of word line WL85 of TLC block 1052. Also, for parity check codes corresponding to even groups of word lines of SLC block(s) belonging to the second set, all the first partial parity check codes generated by the first encoding engine are stored at the MSB portion of the last data page of word line WL83 of TLC block 1052; all the second partial parity check codes generated by the second encoding engine are stored at the LSB portion of the last data page of word line WL84 of TLC block 1052; all the third partial parity check codes generated by the third encoding engine are stored at the CSB portion of the last data page of word line WL84 of TLC block 1052.

As marked by 605C, the parity check codes corresponding to a third set of word lines are programed and stored to the last data pages (LSB, CSB, and MSB portions) of word lines WL126-WL127 of TLC block 1052. Specifically, for parity check codes corresponding to odd groups of word lines of SLC block(s) belonging to the third set, all the third partial parity check codes generated by the third encoding engine are stored at the LSB portion of the last data page of word line WL126 of TLC block 1052; all the first partial parity check codes generated by the first encoding engine are stored at the CSB portion of the last data page of word line WL127 of TLC block 1052; all the second partial parity check codes generated by the second encoding engine are stored at the MSB portion of the last data page of word line WL127 of TLC block 1052. Also, for parity check codes corresponding to even groups of word lines of SLC block(s) belonging to the third set, all the first partial parity check codes generated by the first encoding engine are stored at the CSB portion of the last data page of word line WL126 of TLC block 1052; all the second partial parity check codes generated by the second encoding engine are stored at the MSB portion of the last data page of word line WL126 of TLC block 1052; all the third partial parity check codes generated by the third encoding engine are stored at the LSB portion of the last data page of word line WL127 of TLC block 1052.

Thus, when flash memory module 105 performs the internal copy operation to program data from the SLC blocks 1051A-1051C to the TLC block 1052, if detecting data errors resulting from two word line short and occurring at two data pages (marked by 610) of word lines WL0 and WL1 of the super block, the flash memory module 105 is capable of correcting the errors occurring at the LSB portion of the data page of word line WL0 by using the first partial parity check codes stored at the CSB portion of the last data page of word line 42 of TLC block 1052 and data stored at LSB portions of the other data pages of word line WL0. Similarly, the flash memory module 105 is capable of correcting the errors occurring at the CSB portion of the data page of word line WL0 by using the second partial parity check codes stored at the MSB portion of the last data page of word line 42 of TLC block 1052 and data stored at CSB portions of the other data pages of word line WL0. Similarly, the flash memory module 105 is capable of correcting the errors occurring at the MSB portion of the data page of word line WL0 by using the third partial parity check codes stored at the MSB portion of the last data page of word line 40 of TLC block 1052 and data stored at MSB portions of the other data pages of word line WL0. Similarly, the flash memory module 105 is capable of correcting the errors occurring at the LSB portion of the data page of word line WL1 by using the first partial parity check codes stored at the LSB portion of the last data page of word line 41 of TLC block 1052 and data stored at LSB portions of the other data pages of word line WL1. Similarly, the flash memory module 105 is capable of correcting the errors occurring at the CSB portion of the data page of word line WL1 by using the second partial parity check codes stored at the CSB portion of the last data page of word line 41 of TLC block 1052 and data stored at CSB portions of the other data pages of word line WL1. Similarly, the flash memory module 105 is capable of correcting the errors occurring at the MSB portion of the data page of word line WL1 by using the third partial parity check codes stored at the MSB portion of the last data page of word line 41 of TLC block 1052 and data stored at MSB portions of the other data pages of word line WL1.

If detecting data errors resulting from two word line short and occurring at consecutive data pages (e.g., as marked by 615 and 620) of any two consecutive word lines of the super block, the flash memory module 105 is capable of correcting errors by using corresponding parity check codes stored at each last data page of the last six data pages of one SLC block belonging to each set. In addition, if detecting data errors resulting from one word line open or program fail and occurring at any single one data page of any one word line of the TLC block 1052 (e.g. errors occurs at LSB, CSB, and MSB portions of the same data page or at consecutive portions of two different data pages, the flash memory module 105 is also capable of correcting the errors by using the corresponding parity check codes.

That is, according to the storage management mechanism for using flash memory controller 110 to program/write three sets of data and corresponding parity check codes into SLC blocks 1051A-1051C within flash memory module 105, when the flash memory module 105 uses the internal copy operation to sequentially program/write the data from SLC blocks 1051A-1051C into the TLC block to form a super block, the flash memory module 105 can perform error correction by using the parity check codes stored at the SLC blocks 1051A-1051C if detecting the errors resulting from one word line open, two word line short or program fail.

Further, the above-mentioned operations can be also applied for a flash memory module including MLC blocks and QLC blocks. When a flash memory module including MLC blocks, the classifying operation is arranged for separating data into two groups/sets, and the XOR encoding operation is implemented by using two encoding engines; other operations are similar to those associated with the flash memory module structure with TLC blocks. Identically, when a flash memory module including QLC blocks, the classifying operation is arranged for separating data into four groups/sets, and the XOR encoding operation is implemented by using four encoding engines; other operations are similar to those associated with the flash memory module structure with TLC blocks.

Further, in other embodiments, after completing program of the plurality of first blocks, the flash memory controller 110 can be arranged to perform an external copy operation to program the at least one second block; the external copy operation can be used for replacing the internal copy operation. One of the advantages provided by the external copy operation is that it is easy to design or configure a randomizer/de-randomizer of a flash memory controller. Another advantage provided by the external copy operation is that the data stored in the first blocks can be checked by the flash memory controller 115 again before storing to the second blocks.

Figure 10:
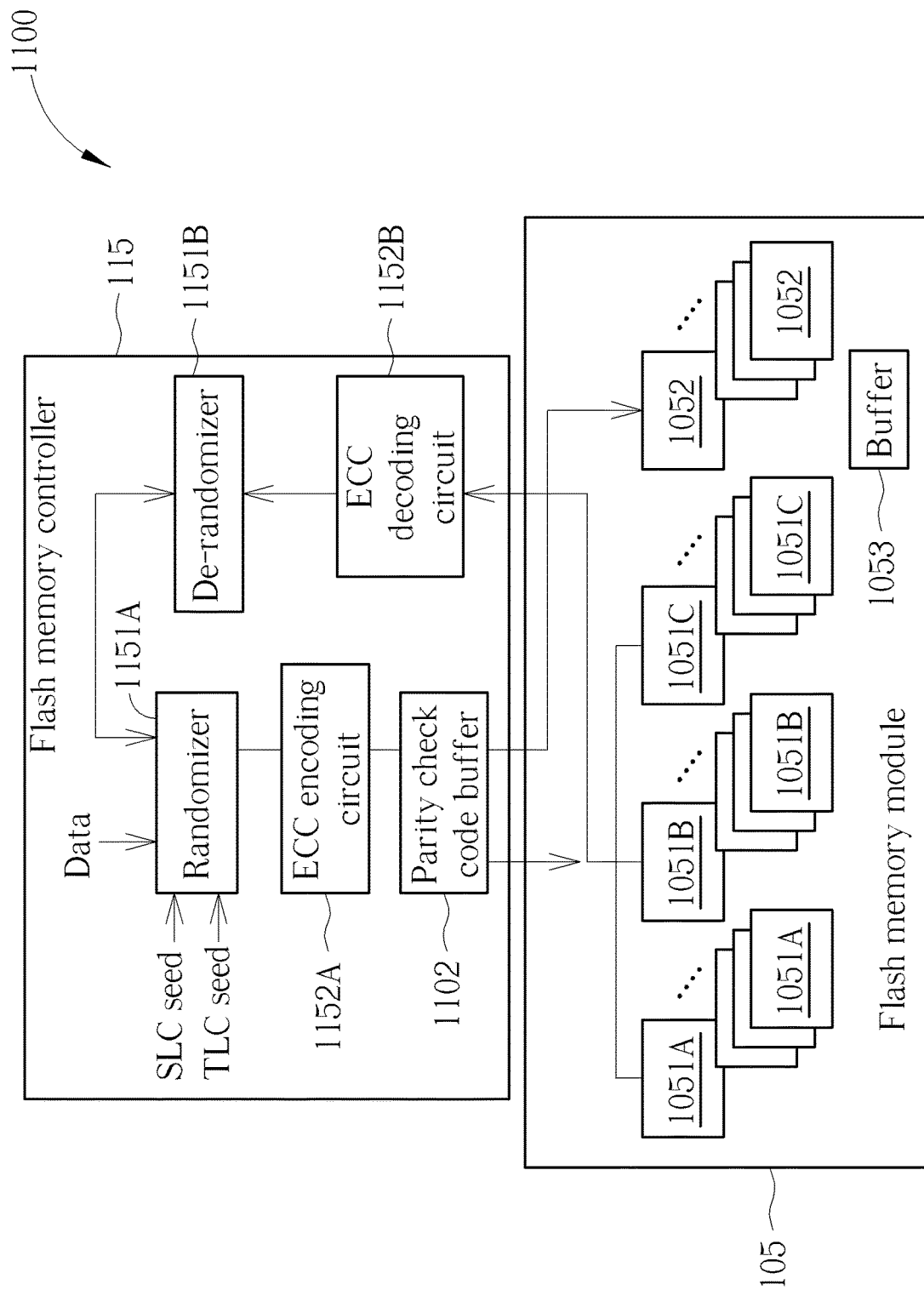
FIG. 10 is a device diagram of the flash memory apparatus according to another embodiment of the invention.

Refer to FIG. 10. FIG. 10 is a device diagram of the flash memory apparatus 1000 according to another embodiment of the invention. The flash memory apparatus 1000 comprises the flash memory module 105 and a flash memory controller 115 which can be used for performing an external copy operation. The flash memory controller 115 comprises the parity check code buffer 1102, a randomizer (hardware circuit or software) 1151A, an ECC encoding circuit 1152A, an ECC decoding circuit 1152B, and a de-randomizer (hardware circuit or software) 1151B. In this embodiment, the randomizer 1151A is arranged to perform a randomize operation upon the data to be programed to the first block(s) according to randomizer seed rules of the first block such as SLC block, and is arranged to perform the randomize operation upon the data to be programed to the second block(s) according to randomizer seed rules of the second block such as TLC block, respectively. The ECC encoding circuit 1151A having the operation similar to that of ECC encoding circuit 1101 is arranged to perform ECC encoding operation upon data, and the ECC decoding circuit 1151B is arranged to perform ECC decoding operation upon data read out from the flash memory module 105. The de-randomizer 1151B is arranged to perform de-randomize operation upon the data read out from the flash memory module 105.

In practice, the operation of controller 115 of FIG. 10 is similar to that of controller 110 of FIG. 1, and the major difference is that the controller 115 is arranged to perform the external copy operation different from the internal copy operation of controller 110. In the super block embodiment, the flash memory controller 115 is arranged for programming data into pages of different flash memory chips by employing an RAID-like (Redundant Array of Independent Disks-like) memory management mechanism to reduce data error rate.

In one embodiment, to program one page data into one page of an SLC block of one flash memory chip, the flash memory controller 115 may employ the randomizer 1151A to perform the randomize operation to process the one page data based on a seed of such page (or sector, or other seed unit) of the SLC block. For example, the seed of such page of the SLC block may be generated according to the physical address of the page of the SLC block, e.g. a function of the physical address of the page of the SLC block. The flash memory controller 115 may employ the ECC encoding circuit 1152A to encode such page data to generate a corresponding parity check code and store such page data and the parity check code into such page of the SLC block. This can be regarded as a first level ECC protection.

After the data have been completely programmed, the flash memory controller 115 can readout and decode three page data of three pages by the ECC decoding circuit 1152B for correcting the read out data. The flash memory controller 115 employ the de-randomizer 1151B to perform the de-randomize operation to process the three page data based on the seeds of the three pages of the SLC blocks respectively. The flash memory controller 115 uses the de-randomized three pages of data to generate data for storing in the TLC block (the three page data are lower, middle, and upper page data of the page data of TLC block). The randomizer 1151A is arranged to randomize the three pages data of the TLC block based on the seeds of lower, middle, and upper pages of the TLC block respectively, e.g., using a first seed for the lower page, a second seed for the middle page, and third seed for the upper page to perform randomize operation upon the three pages of data respectively. The first, second, and third seeds are generated according to the physical storage address the lower, middle, and upper pages of the TLC block respectively. In one embodiment, the ECC encoding circuit 1152A is arranged to generate another corresponding parity check code of such page data of a page of a TLC block and program the parity check code and such page data into the page of the TLC block of the flash memory chip.

In addition, the flash memory controller 115 can be arranged to perform the RAID-like memory management mechanism to program the above-mentioned data into different pages of one flash memory chip for further protection. This can be regarded as a second level ECC protection.

In the following embodiments, the flash memory controller 115 is arranged for programming data into different pages of one flash memory chip by employing an RAID-like (Redundant Array of Independent Disks-like) memory management mechanism. Please note that the present invention is not limited to the following embodiments. In order to improve the efficiency of data programming and reduce the data error rate, the flash memory module 105 is designed to include multiple channels (for example two channels in this embodiment but is not limited). When a channel is used by the controller 115 to program a certain data page, the controller 115 can use another channel to program another data page without waiting for the former channel. Each channel corresponds to respective sequencer in the controller 115 and corresponds to multiple flash memory chips (for example two chips in this embodiment but is not limited). Thus, one channel can be to perform data programming simultaneously for different data pages of multiple flash memory chips without waiting for completion of one chip. In addition, each flash memory chip includes a folded design including two different planes, and different data pages of two blocks respectively located on the two different planes can be programmed simultaneously without waiting for completion of data programming of one block when programming data into one flash memory chip. One super block of the flash memory module 105 is composed by multiple data pages of multiple flash memory chips of multiple channels. In this embodiment, the flash memory controller 115 is arranged to program data by super blocks. It should be noted that in other embodiments each flash memory chip may not comprise the folded design, and one data page of one block is programmed when programming data into one flash memory chip. It is required to wait for some times for programming data to other data pages.

For the flow of data programming, the programmed data in the SLC blocks are not copied and programmed to a TLC block from the SLC blocks directly. The flash memory controller 115 is arranged to use the randomizer 1151A to perform the randomize operation upon data based on the seeds of SLC block and then use the ECC encoding circuit 1152A to perform ECC encoding upon the data, and to program the data and corresponding parity check code into SLC blocks. In the next step, the flash memory controller 115 reads out the data stored by the SLC blocks and then uses the ECC decoding circuit 1152B to perform decoding upon the read out data and uses the de-randomizer 1151B to perform the de-randomize operation upon the read data to generate the de-randomized data In the next step, the randomizer 1151A is arranged to perform the randomize operation upon the de-randomized data outputted by the de-randomizer 1151B based on the seeds of TLC block, for example, changing the randomizer seed according to the address of the TLC blocks where the data will be finally programed to, e.g. physical storage address of the data. The ECC encoding circuit 1152A performs ECC encoding upon the randomized data outputted by the randomizer 1151A, and finally the flash memory controller 115 programs the data and another parity check code into a TLC block.

To perform error correction protection for data programming of SLC blocks 1051A-1051C and data programming of the TLC block 1052, the flash memory controller 115 is arranged for classifying the data into three groups of data. It should be noted that the flash memory controller 115 is arranged for classifying the data into two groups of data if the multiple-level-cell block for example includes MLC units which can be used for storing data of $2^2$ states of 2 bits. The flash memory controller 115 is arranged for classifying the data into four groups of data if the multiple-level-cell block for example includes QLC units which can be used for storing data of $2^4$ states of 4 bits. That is, the units of multiple-level-cell block 1052 are used for storing information of $2^N$ states of N bits wherein N is an integer which is equal to or greater than 2, and the number of SLC blocks is designed as N. The flash memory controller 115 is arranged to classify data to be programmed into N groups of data to respectively program the data into N SLC blocks.

In this embodiment, after classifying the data as three groups of data, the flash memory controller 115 is arranged to execute a first SLC program to program the first group of data into the first SLC block 1051A. The randomizer 1151A performs the randomize operation upon the first group of data based on the randomizer seed rules of SLC block, and the ECC encoding circuit 1152A generates corresponding parity check codes, which can be buffered by the buffer 1102, and writes the corresponding parity check codes into the first SLC block 1051A. In this way, the data program of the SLC block 1051A is completed. Then, the flash memory controller 115 is arranged to execute the second SLC program to program the second group of data into the second SLC block 1051B. The randomizer 1151A performs the randomize operation upon the second group of data based on randomizer seed rules of SLC block, and the ECC encoding circuit 1152A generates corresponding parity check codes (buffered in the buffer 1102) and writes the corresponding parity check codes into the second SLC block 1051B. In this way, the data program of the SLC block 1051B is completed. The flash memory controller 115 then is arranged to execute the third SLC program to program the third group of data into the third SLC block 1051C. The randomizer 1151A performs randomize operation upon the third group of data based on the randomizer seed rules of SLC block, and the ECC encoding circuit 1152A generates corresponding parity check codes (buffered in the buffer 1102) and writes the corresponding parity check codes into the third SLC block 1051C. In this way, the data program of the third SLC block 1051C is completed.

When the flash memory controller 115 performs SLC program to write a particular group of data into a particular SLC block or after programming the particular SLC block has been completed, the flash memory controller 115 is arranged to detect whether there are errors. If errors exist, for example program fail, the flash memory controller 115 is arranged for programming the data again.

In the super block embodiment, the TLC block 1052 is composed by data pages of word lines of different flash memory chips of different channels. A data page of a word line of the TLC block 1052 for example includes an upper page, a middle page, and a lower page. Multiple data pages of the (N)th word line of an SLC block may be configured to be programed/written into multiple upper pages of a word line of the TLC block 1052. Multiple data pages of the (N+1)th word line of the SLC block may be configured to be programed/written into multiple middle pages of the same word line of the TLC block 1052. Multiple data pages of the (N+2)th word line of the SLC block may be configured to be programed/written into multiple lower pages of the same word line of the TLC block 1052. If all the three groups of data have been programed into the TLC block 1052, the program operation for the super block is completed. Please note that the present invention is not limited to the super block programming operation. The external copy operation executed by the flash memory controller 115 is to read out the data previously stored in the three SLC blocks 1051A, 1051B, and 1051C, to employ the ECC decoding circuit 1152B to decode the data read out from the SLC blocks 1051A, 1051B, and 1051C, to employ the de-randomizer 1151B to perform the corresponding de-randomize operation upon the data outputted by the ECC decoding circuit 1152B to generate the de-randomized data, to employ the randomizer 1151A to perform the randomize operation upon the de-randomized data outputted by the de-randomizer 1151B based on the seeds of TLC block, and to employ the ECC encoding circuit 1152A to encode the randomized data outputted by the randomizer 1151A to generate another parity check code. The flash memory controller 115 stores data of a TLC block size with such corresponding parity check codes into locations of upper, middle, and lower pages of the word line of the TLC block 1052.

The ECC encoding circuit 1152A can adopt RAID-like RS (Reed Solomon) encoding operation, RAID-like XOR (exclusive-OR) encoding operation, BCH encoding operation, LDPC encoding operation or any other ECC encoding operation. In one example, the ECC encoding circuit 1152A performs LDPC encoding operation upon a page of data and performs RAID-like encoding operation upon a block or blocks of data for further protection. The example of one SLC programming executed by the flash memory controller 115 of FIG. 10 to adopt/perform the RAID-like RS (Reed Solomon) encoding operation to program a particular group of data into an SLC block of flash memory module 105 is similar/like to the example shown in FIG. 2. In addition, the example of one TLC programming executed by the flash memory controller 115 of FIG. 10 to adopt/perform the RAID-like RS (Reed Solomon) encoding operation to form a supper block is similar/like to the example shown in FIG. 4. The detailed description is not described for brevity.

The example of one SLC programming executed by the flash memory controller 115 of FIG. 10 to adopt/perform the RAID-like XOR (exclusive-OR) encoding operation to program a particular group of data into an SLC block of flash memory module 105 is similar/like to the example shown in FIG. 5. In addition, the example of one TLC programming executed by the flash memory controller 115 of FIG. 10 to adopt/perform the RAID-like XOR (exclusive-OR) encoding operation to form a supper block is similar/like to the example shown in FIG. 6. The detailed description is not described for brevity.

Further, the above-mentioned operations can be also applied for a flash memory module including MLC blocks and QLC blocks. When a flash memory module including MLC blocks, the classifying operation is arranged for separating data into two groups/sets, and the XOR encoding operation is implemented by using two encoding engines; other operations are similar to those associated with the flash memory module structure with TLC blocks. Identically, when a flash memory module including QLC blocks, the classifying operation is arranged for separating data into four groups/sets, and the XOR encoding operation is implemented by using four encoding engines; other operations are similar to those associated with the flash memory module structure with TLC blocks. Further, it should be noted that the circuit locations of randomizer 1151A and ECC encoding circuit 1152A can be swapped, and the circuit locations of de-randomizer 1151B and ECC decoding circuit 1152B are be swapped correspondingly.

Regarding to ECC code overhead of the data storage mechanism mentioned above, if two channels are employed for programming two memory chips and two blocks can be simultaneously programed based on the folded plane design of each memory chip, for data programming of one SLC block, there are (128) word lines in the SLC block and totally the SLC block has (8*128) data pages. Based on the data storage mechanism mentioned above, it is only required to use six data pages among the total (8*128) data pages to store corresponding parity check codes. The percentage of ECC code overhead compared to the total data storage space, i.e. 6/(128*8), is smaller than one. That is, for data programming of SLC blocks and TLC block(s), it is only necessary to use a data storage space of less than 1% of the total data storage space for storing corresponding parity check codes of ECC operation. The utilization rate of a flash memory storage space is higher compared to the conventional scheme. Additionally, if four channels are employed for programming four memory chips and two blocks can be simultaneously programed based on the folded plane design of each memory chip, for data programming of one SLC block, there are (128) word lines in the SLC block and totally the SLC block has (4*4*2*128) data pages. Based on the data storage mechanism mentioned above, it is only required to use six data pages among the total (4*4*2*128) data pages to store corresponding parity check codes. The percentage of ECC code overhead compared to the total data storage space, i.e. 6/(4*4*2*128), is decreased to be smaller and is almost 0.15%. That is, for data programming of SLC blocks and TLC block(s), it is only necessary to use almost 0.15% of the total data storage space for storing corresponding parity check codes of ECC operation. The utilization rate of a flash memory storage space can be much higher compared to the conventional scheme.

Figure 11:
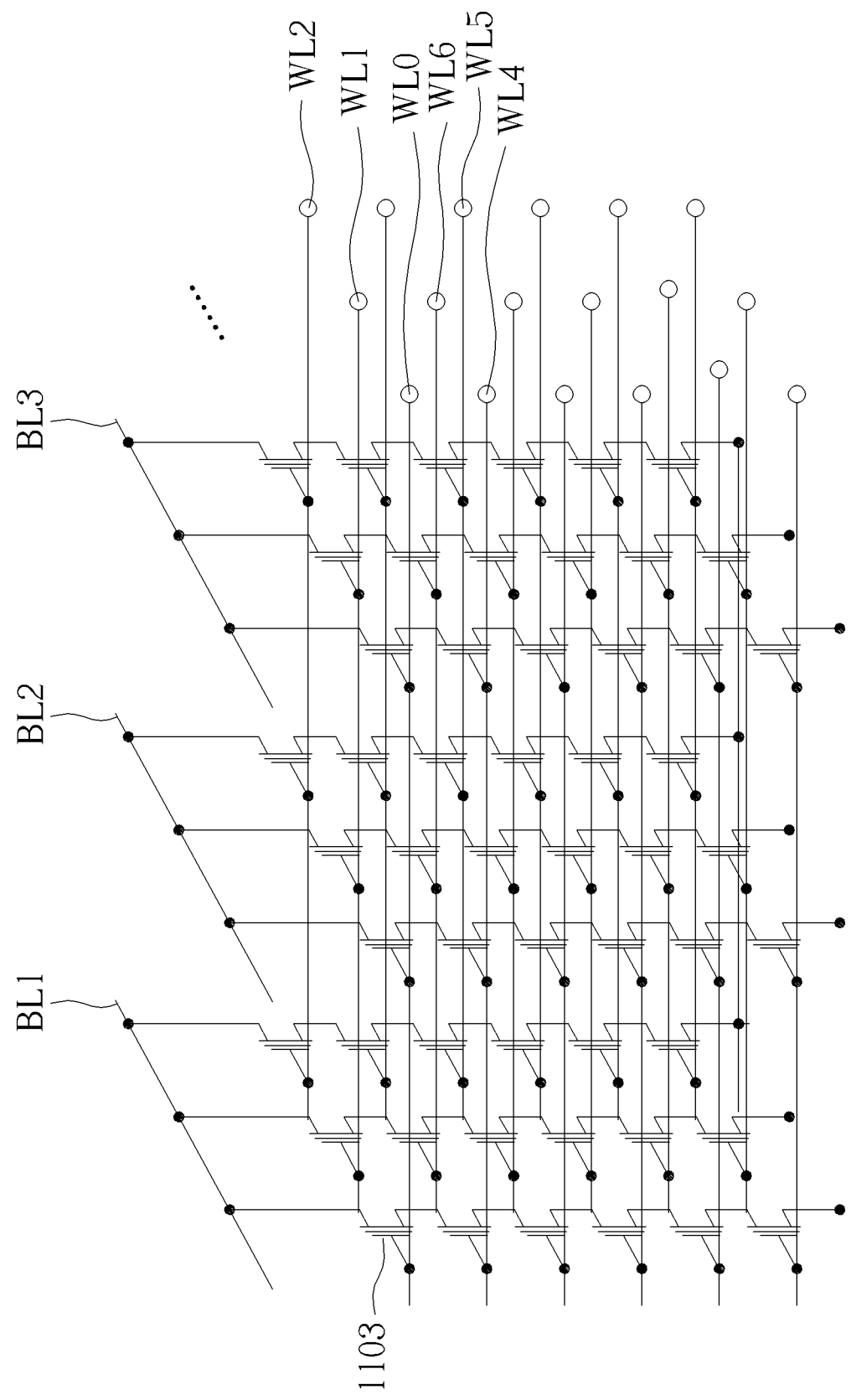
FIG. 11 is a diagram of a 3D NAND-type flash memory.

Additionally, in other embodiment, the flash memory module 105 may be a 3D NAND-type flash memory module, and the flash memory controller 115 can be arranged to program data into a block (may be used as a single-level-cell block or as a multiple-level-cell block) of a 3D NAND-type flash memory module and can perform the above-mentioned external copy operation to program data the data read form single-level-cell blocks into a multiple-level-cell block of such 3D NAND-type flash memory module. Please refer to FIG. 11, which is a diagram of a 3D NAND-type flash memory. As shown in FIG. 11, the 3D NAND-type flash memory comprises multiple floating gate transistors 1103, and the structure of 3D NAND-type flash memory is made up of multiple bit lines (e.g. BL1-BL3) and multiple word lines (e.g. WL0-WL2 and WL4-WL6). One bit line can be also called one string. In FIG. 11, taking an example of a top plane, at least one data page constitutes all floating gate transistors on the word line WL0, and another at least one data page constitutes all floating gate transistors on the word line WL1; another at least one data page constitutes all floating gate transistors on the word line WL2, and other so on. Further, for example, the definition of one data page (logic data page) and the relation between such data page and word line WL0 may be different, and which may depend on different data programming types adopted by the flash memory. Specifically, all floating gate transistors on the word line WL0 correspond to one single logic data page when the flash memory adopts single-level cell (SLC) data programming. All floating gate transistors on the word line WL0 may correspond to two, three, or four logic data pages when the flash memory adopts multi-level cell (MLC) data programming. For example, a triple-level cell (TLC) memory structure means that all floating gate transistors on the word line WL0 correspond to three logical data pages. Instead, a quad-level cell (QLC) memory structure means that all floating gate transistors on the word line WL0 correspond to four logical data pages. The description for the TLC memory structure or QLC memory structure is not detailed here for brevity. Additionally, for the program/erase operation of flash memory controller 115, one data page is a minimum data unit which is programed by the controller 115 into the module 105, and one block is a minimum data unit which is erased by the controller 115; that is, the controller 115 programs at least one data page for one data programming operation, and erases at least one block for one erase operation.

Figure 12:
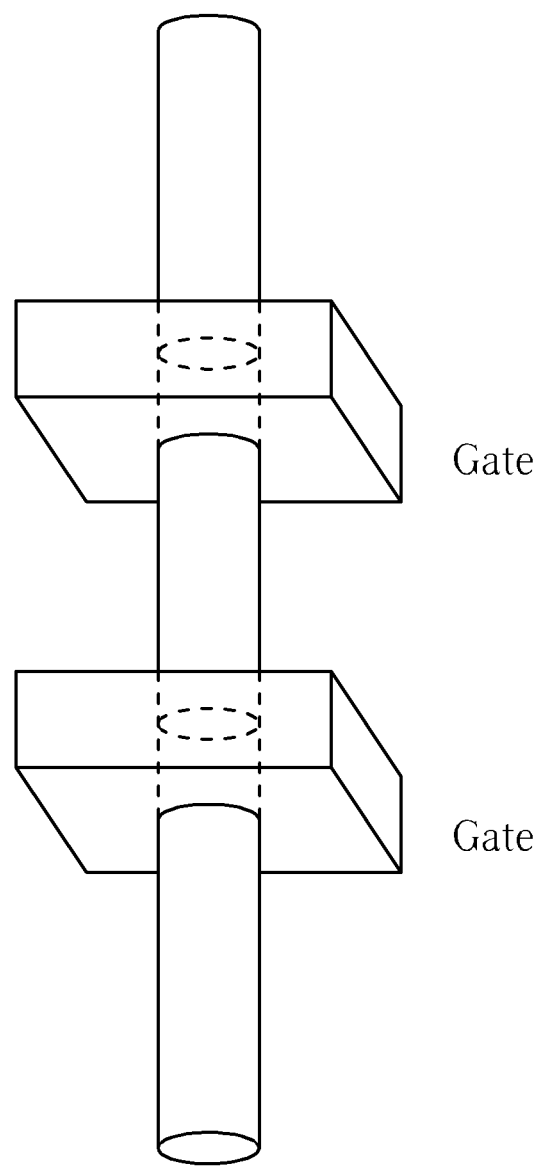
FIG. 12 is a schematic diagram illustrating floating gate transistors.

Please refer to FIG. 12, which is a schematic diagram illustrating floating gate transistors 1103. As shown in FIG. 12, the gate and floating gate of each floating gate transistor are disposed all around its source and drain, to improve the capability of channel sensing.

It should be noted that the examples of 3D NAND-type flash memory and floating gate transistors 1103 shown in FIG. 11 and FIG. 12 are not meant to be limitations of the present invention. In other embodiments, 3D NAND-type flash memory may be designed or configured as different structures; for example, a portion of word lines may be mutually connected. Also, the design or configuration of floating gate transistor 1103 may be modified as different structures.

In some conventional 3D NAND-type flash memory structure, multiple word lines are defined as or classified into a word line set, i.e. a set of word lines, and such word line set correspond to or include a common control circuit. This inevitably causes that data errors occur at other floating gate transistors on the other word lines of such word line set when programming data to the floating gate transistors on a word line of such word line set fails. In the embodiment, the word lines disposed/positioned on the same plane is configured as or classified into a word line set. Refer back to FIG. 11. Word lines WL0-WL3 are classified into a first word line set, and word lines WL4-WL7 are classified into a second word line set; and other so on. Refer to FIG. 13, which is a diagram illustrating multiple word line sets in one block. As shown in FIG. 13, it is assumed that the block has forty-eight 3D stacked planes, i.e. 48 word line sets. Each word line set has four word lines and thus has all transistors on total one hundred and ninety-two word lines. As shown in FIG. 13, the block has forty-eight word line sets which are represented by WL_G0-WL_G47. Additionally, in this figure, the block is a TLC block. That is, floating gate transistors on each word line can be used for storing data content of three data pages. As shown by FIG. 13, for example, floating gate transistors on word line WL0 included by the word line set WL_G0 can be used for storing lower data page P0L, middle data page P0M, and upper data page P0U. The floating gate transistors on word line WL1 included by the word line set WL_G0 can be used for storing lower data page P1L, middle data page P1M, and upper data page P1U. The floating gate transistors on word line WL2 included by the word line set WL_G0 can be used for storing lower data page P2L, middle data page P2M, and upper data page P2U. The floating gate transistors on word line WL3 included by the word line set WL_G0 can be used for storing lower data page P3L, middle data page P3M, and upper data page P3U. When the controller 115 programs or writes data into the data pages of word line set WL_G0, the controller 115 is arranged for sequentially programs data into the floating gate transistors on word lines WL0, WL1, WL2, and WL3. Even if data is successfully programed into word lines WL0 and WL1 but programming other data into word line WL2 fails (i.e. program fail), programming fail will occur at the word line set WL_G0 since the program fail of word line WL2 causes errors at the word lines WL0 and WL1.

Further, in some situations, even data has been successfully programed into the word line set WL_G0, there is a possibility that the data cannot be read out from word line set WL_G0 or reading errors occur. For instance, the data cannot be read if one word line open occurs; all the data of one word line set will become erroneous if one word line in such word line set is open. Further, if two word lines in different word line sets are shorted (e.g. word lines WL3 and WL4 are shorted), then all the data of two word line sets WL_G0 and WL_G1 cannot be read successfully. That is, the two word line sets WL_G0 and WL_G1 are equivalently shorted.

As mentioned above, since data errors may occur at one or two adjacent word line set(s) due to the program fail, word line open, and word line short when programming data into or reading data from a flash memory, to solve the problems, in the embodiment a method/mechanism for accessing flash memory module 105 is provided. One of the advantages is that the method/mechanism merely consumes less resource (i.e. occupies less memory space).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory apparatus, comprising:
a flash memory module comprising a plurality of storage blocks; and
a flash memory controller, configured for:
writing a plurality of groups of data and a first corresponding parity check code into the flash memory module according to a first bit number mode;
executing error correction and de-randomize operation upon the groups of data to generate de-randomized data;
executing randomize operation upon the de-randomized data according to randomizer seed rules to generate randomized data; and
performing error code encoding upon the randomized data and writing the randomized data into the flash memory module according to a second bit number mode.

2. The flash memory apparatus of claim 1, wherein the groups of data are read from the flash memory module to be read out data, and the flash memory controller comprises:
a decoding circuit, configured for executing the error correction upon the read out data;
a de-randomizer, coupled to the decoding circuit, configured for performing the de-randomize operation upon the read out data to generate the de-randomized data;
a randomizer, coupled to the de-randomizer, configured for executing the randomize operation upon the de-randomized data according to a set of seeds to generate the randomized data; and
an encoding circuit, coupled to the randomizer, configured for performing the error code encoding upon the randomized data to generate and write a second corresponding parity check code into the flash memory module.

3. The flash memory apparatus of claim 1, wherein the flash memory controller is arranged to enable an SLC programming mode by sending a set feature command sequence which sequentially comprises a set feature command indicated by a hexadecimal value of EFh, a specific address of a control register of a chip of the flash memory module, and a specific hexadecimal value of 01h to be written into the control register, into the flash memory module.

4. The flash memory apparatus of claim 1, wherein the flash memory controller is arranged to enable an MLC programming mode by sending a set feature command sequence which sequentially comprises a set feature command indicated by a hexadecimal value of EFh, a specific address of a control register of a chip of the flash memory module, and a specific hexadecimal value of 02h to be written into the control register, into the flash memory module.

5. The flash memory apparatus of claim 1, wherein the flash memory controller is arranged to enable a TLC programming mode by sending a set feature command sequence which sequentially comprises a set feature command indicated by a hexadecimal value of EFh, a specific address of a control register of a chip of the flash memory module, and a specific hexadecimal value of 04h to be written into the control register, into the flash memory module.

6. The flash memory apparatus of claim 1, wherein the flash memory controller is arranged to perform a TLC programming by sequentially sending a programming command indicated by a hexadecimal value of 80h as a start, information of an address to be programed, specific data to be programed, and a programming command indicated by a hexadecimal value of 10h as an end.

7. The flash memory apparatus of claim 6, wherein the flash memory controller is arranged to change the TLC programming into an SLC programming by further sending a specific command/prefix indicated by a hexadecimal value of A2h before sending the programming command.

8. The flash memory apparatus of claim 1, wherein the flash memory controller is arranged to send a specific command/prefix before sending an erase command, a read command, or a programming command so as to enable an SLC mode, and is arranged to send another specific command/prefix before sending the erase command, the read command, or the programming command so as to disable the SLC mode.

9. A flash memory storage management method used for a flash memory module having a plurality of storage blocks, and the flash memory storage management method comprises:
writing a plurality of groups of data according to a first bit number mode into the flash memory module;
executing error correction and de-randomize operation upon the groups of data to generate de-randomized data;
executing randomize operation upon the de-randomized data according to randomizer seed rules to generate randomized data; and
performing error code encoding upon the randomized data and writing the randomized data according to a second bit number mode into the flash memory module.

10. The method of claim 9, wherein a cell of each storage block can be used for storing data of a first bit number corresponding to the first bit number mode or data of a second bit number corresponding to the second bit number mode; the cell of a block corresponding to the second bit number is arranged for storing data of 3 bits, and a second block is a triple-level-cell block, and the step of classifying the data to be programmed into the plurality of groups of data comprises: classifying the data to be programmed into three groups of data to respectively program the three groups of data into three single-level-cell blocks.

11. A flash memory controller connected to a flash memory module having a plurality of storage blocks, the flash memory controller being configured for writing a plurality of groups of data according to a first bit number mode into the flash memory module, and the flash memory controller comprises:
- a decoding circuit, configured for executing error correction upon the groups of data which is read out by the flash memory controller from the flash memory module;
- a de-randomizer, coupled to the decoding circuit, configured for performing a de-randomize operation upon the groups of data to generate de-randomized data;
- a randomizer, coupled to the de-randomizer, configured for executing a randomize operation upon the de-randomized data according to randomizer seed rules to generate randomized data; and
- an encoding circuit, coupled to the randomizer, configured for performing error code encoding upon the randomized data according to a second bit number mode;
- wherein the flash memory controller is arranged for writing the randomized data according to the second bit number mode into the flash memory module.

12. The flash memory controller of claim 11, wherein, a cell of each storage block can be used for storing data of a first bit number corresponding to the first bit number mode or data of a second bit number corresponding to the second bit number mode; the cell of a block corresponding to the second bit number is arranged for storing data of 3 bits, and a second block is a triple-level-cell block, and the flash memory controller is arranged for classifying the data to be programmed into three groups of data to respectively program the three groups of data into three single-level-cell blocks.

13. The flash memory controller of claim 11, wherein the flash memory controller is arranged to enable an SLC programming mode by sending a set feature command sequence which sequentially comprises a set feature command indicated by a hexadecimal value of EFh, a specific address of a control register of a chip of the flash memory module, and a specific hexadecimal value of 01h to be written into the control register, into the flash memory module.

14. The flash memory controller of claim 11, wherein the flash memory controller is arranged to enable an MLC programming mode by sending a set feature command sequence which sequentially comprises a set feature command indicated by a hexadecimal value of EFh, a specific address of a control register of a chip of the flash memory module, and a specific hexadecimal value of 02h to be written into the control register, into the flash memory module.

15. The flash memory controller of claim 11, wherein the flash memory controller is arranged to enable a TLC programming mode by sending a set feature command sequence which sequentially comprises a set feature command indicated by a hexadecimal value of EFh, a specific address of a control register of a chip of the flash memory module, and a specific hexadecimal value of 04h to be written into the control register, into the flash memory module.

16. The flash memory controller of claim 11, wherein the flash memory controller is arranged to perform a TLC programming by sequentially sending a programming command indicated by a hexadecimal value of 80h as a start, information of an address to be programed, specific data to be programed, and a programming command indicated by a hexadecimal value of 10h as an end.

17. The flash memory controller of claim 16, wherein the flash memory controller is arranged to change the TLC programming into an SLC programming by further sending a specific command/prefix indicated by a hexadecimal value of A2h before sending the programming command.

18. The flash memory controller of claim 11, wherein the flash memory controller is arranged to send a specific command/prefix before sending an erase command, a read command, or a programming command so as to enable an SLC mode, and is arranged to send another specific command/prefix before sending the erase command, the read command, or the programming command so as to disable the SLC mode.

* * * * *